US008674636B2

(12) United States Patent
Matsuo et al.

(10) Patent No.: US 8,674,636 B2
(45) Date of Patent: Mar. 18, 2014

(54) POWER CONVERSION DEVICE

(75) Inventors: Takeshi Matsuo, Hitachinaka (JP);
Kinya Nakatsu, Hitachinaka (JP);
Toshiya Satoh, Hitachiota (JP); Ken Maeda, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 313 days.

(21) Appl. No.: 13/126,410

(22) PCT Filed: Oct. 26, 2009

(86) PCT No.: PCT/JP2009/068324
§ 371 (c)(1),
(2), (4) Date: Jun. 29, 2011

(87) PCT Pub. No.: WO2010/050428
PCT Pub. Date: May 6, 2010

(65) Prior Publication Data
US 2011/0249421 A1    Oct. 13, 2011

(30) Foreign Application Priority Data
Oct. 29, 2008    (JP) .................................. 2008-277591

(51) Int. Cl.
*H02P 6/00*    (2006.01)
*H02P 6/14*    (2006.01)
(52) U.S. Cl.
CPC ........................................ *H02P 6/14* (2013.01)
USPC ............ 318/400.25; 318/400.24; 318/400.01; 318/700
(58) Field of Classification Search
CPC ....................................................... H02P 6/14
USPC .................... 318/400.25, 400.24, 400.01, 700
See application file for complete search history.

(56) References Cited

U.S. PATENT DOCUMENTS 5,614,803 A * 3/1997 Morioka et al. ............... 318/801
5,804,973 A * 9/1998 Shinohara et al. ............ 324/548
(Continued)

FOREIGN PATENT DOCUMENTS

JP    2004-104860 A    4/2004
JP    2005-12940 A     1/2005
(Continued)

OTHER PUBLICATIONS

International Search Report including English language translation dated Dec. 1, 2009 (Two (2) pages).
Chinese Office Action with English Translation dated Apr. 28, 2013 (twelve (12) pages).

*Primary Examiner* — Bentsu Ro
*Assistant Examiner* — David Luo
(74) *Attorney, Agent, or Firm* — Crowell & Moring LLP

(57) ABSTRACT

A power conversion device for a vehicle includes: a power module that includes a switching device and, upon operation of the switching device, converts DC power into AC power to be supplied to an electric machine for driving a vehicle; a capacitor module that includes a smoothing capacitor element, an input-side power source terminal for receiving DC power, and an output-side power source terminal for supplying DC power to the power module; and a noise removal capacitor for removing noise, wherein: the noise removal capacitor is built in the capacitor module, and the noise removal capacitor is electrically connected to the input-side power source terminal in a position where a distance between a connection position of the noise removal capacitor and the input-side power source terminal is less than a distance between a connection position of the noise removal capacitor and the output-side power source terminal of the capacitor module.

7 Claims, 26 Drawing Sheets

(56) References Cited

U.S. PATENT DOCUMENTS

| | | | |
|---|---|---|---|
| 6,836,085 B2 * | 12/2004 | Kawada et al. | 318/139 |
| 7,561,448 B2 * | 7/2009 | Katayama et al. | 363/40 |
| 2004/0257841 A1 | 12/2004 | Taguchi et al. | |

FOREIGN PATENT DOCUMENTS

| | | |
|---|---|---|
| JP | 2006-20389 A | 1/2006 |
| JP | 2006-333647 A | 12/2006 |
| JP | 2008-61282 A | 3/2008 |

* cited by examiner (A)

(B)

(C)

(a)

(b)

(a)

(b)

(a)

(b)

(a)

(b)

(a)

(b)

(c)

POWER CONVERSION DEVICE

TECHNICAL FIELD

The present invention relates to a power conversion device, in particular a power conversion device for driving a hybrid vehicle or an electric vehicle.

BACKGROUND ART

For reducing the size of a power conversion device, a technology to put the components of the device into a module has long been studied. For example, Japanese Laid Open Patent Publication No. 2004-104860 (Patent Literature 1) proposes a technology in which film capacitors for smoothing are mounted on a board, and in addition, line-bypass capacitors for reducing noise contamination and discharge resistors are mounted on the same board.

CITATION LIST

Patent Literature

PLT1: Japanese Laid Open Patent Publication No. 2004-104860

SUMMARY OF INVENTION

Technical Problem

However, it is required to further reduce the impact of noise contamination in the power conversion device.

Solution To Problem

According to the 1st aspect of the present invention, a power conversion device for a vehicle comprises: a power module that includes a switching device and, upon operation of the switching device, converts DC power into AC power to be supplied to an electric machine for driving a vehicle; a capacitor module that includes a smoothing capacitor element, an input-side power source terminal for receiving DC power, and an output-side power source terminal for supplying DC power to the power module; and a noise removal capacitor for removing noise, wherein: the noise removal capacitor is built in the capacitor module, and the noise removal capacitor is electrically connected to the input-side power source terminal in a position where a distance between a connection position of the noise removal capacitor and the input-side power source terminal is less than a distance between a connection position of the noise removal capacitor and the output-side power source terminal of the capacitor module.

According to the 2nd aspect of the present invention, in a power conversion device for a vehicle according to the 1st aspect, it is preferred that the input-side power source terminal is placed opposite the output-side power source terminal across the smoothing capacitor element.

According to the 3rd aspect of the present invention, in a power conversion device for a vehicle according to the 1st aspect, it is preferred that the capacitor module includes a plate-like conductor, constituted with a positive electrode-side conductor and a negative electrode-side conductor in a superimposed state, allows the smoothing capacitor element and the input-side power source terminal to be electrically connected.

According to the 4th aspect of the present invention, in a power conversion device for a vehicle according to the 3rd aspect, it is preferred that the capacitor module includes a case for housing at least the smoothing capacitor element; and the plate-like conductor is electrically connected with the smoothing capacitor element in a housing portion of the case, extends from the housing portion of the case to outside the case in a superimposed state of the positive electrode-side conductor and the negative electrode-side conductor, and is provided with the output-side power source terminal formed at a top end of the plate-like conductor.

According to the 5th aspect of the present invention, in a power conversion device for a vehicle according to the 1st aspect, it is preferred that the capacitor module includes a case for housing at least the smoothing capacitor element and the noise removal capacitor; and a sealing material for sealing the smoothing capacitor element and the noise removal capacitor inside the case.

According to the 6th aspect of the present invention, in a power conversion device for a vehicle according to the 4th or 5th aspect, it is preferred that the power module includes a metal housing for housing the capacitor module and the noise removal capacitor; the metal housing includes a fixing portion for fixing the case of the capacitor module to the metal housing; and the noise removal capacitor has wiring, which extends from a ground-side terminal of the noise removal capacitor and is electrically connected with the fixing portion.

According to the 7th aspect of the present invention, in a power conversion device for a vehicle according to the 1st aspect further comprises: a discharge circuit section for discharging charge stored in the smoothing capacitor module, wherein the discharge circuit section is placed opposite the noise removal capacitor across the smoothing capacitor element.

In this manner, a noise removal capacitor becomes less susceptible to switching of a power module or the like, thereby reducing the impact of noise contamination in the power conversion device.

Advantageous Effect of the Invention

A power conversion device using the present invention allows the impact of noise contamination to be reduced.

DESCRIPTION OF EMBODIMENTS

Figure 1:
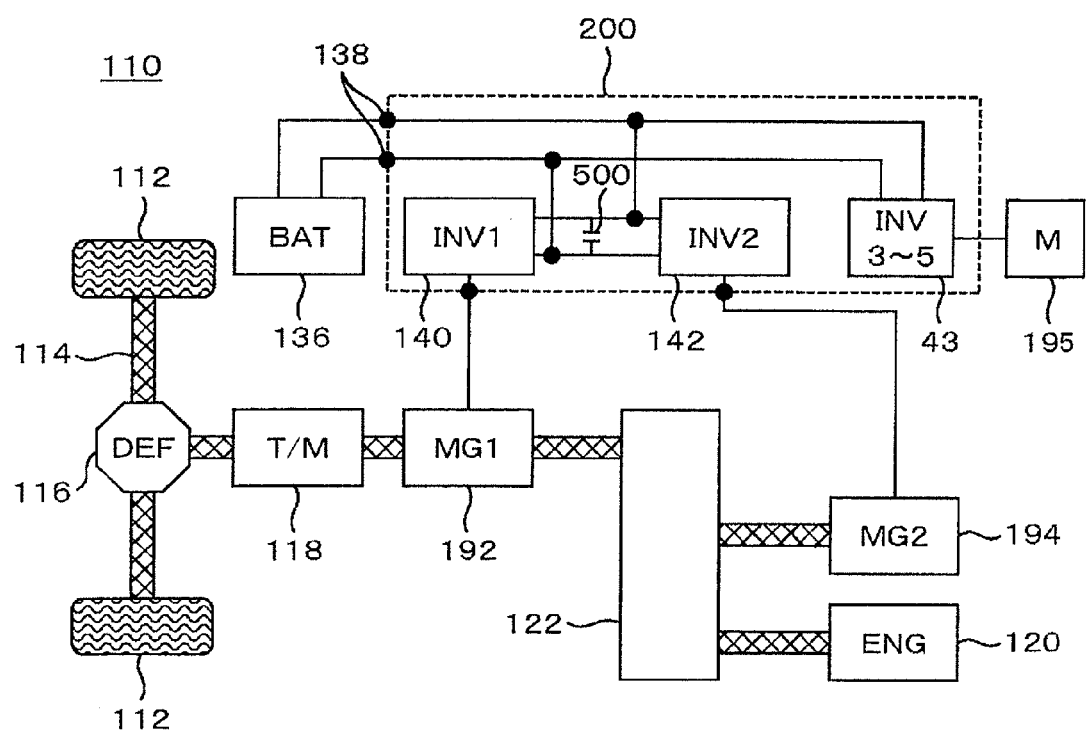
FIG. 1 is a diagram showing a control block of a hybrid electric vehicle.

The power conversion device according to an embodiment of the present invention will now be explained in detail with reference to the drawings. While the power conversion device according to an embodiment of the present invention can be applied to a hybrid electric vehicle and a pure electric vehicle, the control structure and the circuit configuration of the power conversion device will now be explained, as a representative example for a case that the power conversion device according to an embodiment of the present invention is applied to a hybrid vehicle, with reference to FIG. 1 and FIG. 2. FIG. 1 is a diagram showing a control block of a hybrid electric vehicle.

With regard to the power conversion device according to an embodiment of the present invention, an explanation will be made in terms of an example of an in-vehicle power conversion device for an in-vehicle electric machine system to be equipped on a vehicle, in particular, an inverter device for driving a vehicle used in an electric machine system for driving a vehicle, which is operated a very hard installation condition and a hard operation environment. The inverter device for driving a vehicle is installed in an electric machine system for driving a vehicle as a control device that controls operation of an electric machine for driving a vehicle. The inverter device converts DC power supplied from an in-vehicle battery that constitutes an in-vehicle power source or from an in-vehicle power generation device into intended AC power, and supplies the obtained AC power to the electric machine for driving a vehicle, so as to control operation of the electric machine for driving a vehicle. In addition, the electric machine for driving a vehicle has also a function as an electric generator, and correspondingly the inverter device for driving a vehicle functions to convert AC power generated by the electric machine for driving a vehicle into DC power dependent on the driving mode of the vehicle. After conversion, the DC power is supplied to the vehicle-mounted battery.

It is to be noted that, while the structure of the present embodiment is most suited for a power conversion device for driving a vehicle, such as an automobile and a truck, the present invention can also be applied to other power conversion devices, for instance, power conversion devices for electric trains, boats and ships, aircrafts, and the like, and further for industrial power conversion devices used as control devices for electric machines driving plant equipments, or household power conversion devices used as control devices of electric machines driving household photovoltaic power generation systems and household electrical appliances.

In FIG. 1, a hybrid electric vehicle (hereinafter referred to as "HEV") 110 is a kind of an electrically powered vehicle in which two vehicle driving systems are installed. One is an internal combustion engine system which utilizes the engine 120 as a power source. The engine system is mainly used as a driving source for the HEV 110. The another is a in-vehicle electric machine system which operates the generators 192 and 194 as power sources. The in-vehicle electric machine system is mainly used as a driving source for the HEV and an electric power generation source for the HEV. The motor generators 192 and 194, which are, for example, synchronous machines or induction machines, work as motors or electric generators depending upon the driving mode, and hence they are herein referred to as motor-generators.

A front axle 114 is rotatably supported in a front portion of the vehicle body. Two front wheels 112 are each provided at both ends of the front axle 114. A rear axle (not shown in the figures) is rotatably supported in a rear portion of the vehicle body. Two rear wheels are each provided at both ends of the rear axle. While the HEV of the present embodiment adopts a so-called front-wheel drive system, in which the front wheels 112 work as driving wheels that are driven by power and the rear wheels work as carrying wheels that follow, it may adopt the contrary, i.e., a rear-wheel drive system.

A front wheel-side differential gear (hereinafter referred to as "front wheel-side DEF") 116 is provided at the middle of the front axle 114. The front axle 114 is mechanically connected to an output side of the front-wheel side DEF 116. An output shaft of a transmission 118 is mechanically connected to an input side of the front-wheel side DEF 116. The front-wheel side DEF 116 is a differential power distribution mechanism that distributes rotational driving force that has been transmitted through the transmission 118 to the right and left of the front axle 114. An output side of a motor generator 192 is mechanically connected to an input side of the transmission 118. An output side of the engine 120 and an output side of the motor generator 194 are mechanically connected to an input side of the motor generator 192 through a power distribution mechanism 122. It is to be noted that the motor generators 192 and 194 and the power distribution mechanism 122 are stored inside a housing of the transmission 118.

The motor generators 192 and 194 are synchronous machines employing rotors with permanent magnets, and their operations are controlled as AC powers to be supplied to armature windings of stators are controlled by the respective inverter devices 140 and 142. A battery 136 is electrically connected to the inverter devices 140 and 142, so that electric power can be mutually transferred between the battery 136 and the inverter devices 140 and 142.

In the present embodiment, in the HEV 110 two electric motor-generator units are installed, i.e., a first electric motor generator unit constituted with the motor generator 192 and the inverter device 140 and a second electric motor generator unit constituted with the motor generator 194 and the inverter device 142, each to be used differently dependent on the vehicle driving modes. More specifically, in order to assist drive torque of the vehicle when the vehicle is driven by power from the engine 120, the second electric motor-generator unit is activated, as a power generation unit, on power of the engine 120 so that it generates electric power, and electric power obtained by the power generation causes the first electric motor-generator unit to be operated as an electric motor unit. In addition, similarly, when assisting the vehicle speed, the first electric motor-generator unit is operated as a power generation unit by power of the engine 120 so that it generates electric power, and by the obtained electric power the second electric motor-generator unit is operated as an electric motor unit.

Further, in the present embodiment, the first electric motor-generator unit is operated by electric power of the battery 136 as an electric motor unit so that the vehicle can be driven only on power of the motor-generator 192. Furthermore, in the present embodiment, the first electric motor-generator unit or the second electric motor-generator unit is operated as a power generation unit, driven by power of the engine 120 or power from the wheels so as to generate electric power by which the battery 136 can be charged.

The battery 136 is also used as a power source for driving a motor 195 for auxiliaries. The auxiliaries are, for example, a motor that drives a compressor of an air conditioner or a motor that drives a hydraulic pump for controlling. DC power is supplied from the battery 136 to an inverter device 43, converted into AC electric power by the inverter device 43, and supplied to the motor 195. The inverter device 43 has the same function as that of the inverter devices 140 and 142, which controls phase, frequency, and electric power of AC to be supplied to the motor 195. For instance, by supplying a leading phase AC power with respect to rotation of the rotor of the motor 195, the motor 195 generates torque. On the other hand, by generating a lagging phase AC power, the motor 195 works as an electric generator and the motor 195 operates in a regenerative braking state. Such a control function of the inverter device 43 is the same as the control function of the inverter devices 140 and 142. Since the capacity of the motor 195 is less than that of the motor generators 192 and 194, the maximum conversion electric power of the inverter device 43 is less than that of the inverter devices 140 and 142. However, the circuit configuration of the inverter device 43 is basically the same as that of the inverter devices 140 and 142.

The inverter devices 140, 142, and 43, and the capacitor module 500 are in an electrically close relationship. They require in common further measures against heat generation. In addition, the volume of the device is required to be designed as small as possible. From those points, in a power conversion device described later in detail, the inverter devices 140 and 142, the inverter device 43, and the capacitor module 500 are housed within the housing of the power conversion device. This structure allows a compact, highly reliable device to be achieved.

In addition, arranging the inverter devices 140 and 142, the inverter device 43, and the capacitor module 500 in one housing is effective for simplifying wirings and for noise reduction. In addition, inductance in the connection circuit between the capacitor module 500 and the inverter devices 140, 142, and 43 can be reduced, voltage spikes can be reduced, heat generation can be suppressed, and improvement of heat dissipation efficiency can be achieved.

Next, the electrical circuit structure of the inverter devices 140 and 142 or the inverter device 43 will be explained with reference to FIG. 2. It is to be noted that, in the embodiment shown in FIG. 1 and FIG. 2, an example in which the inverter devices 140 and 142 or the inverter device 43 are individually configured will be explained. Since the inverter devices 140 and 142 or the inverter device 43 have a similar configuration, a similar operation, and a similar function, the inverter device 140 will now be explained as a representative one.

A power conversion device 200 according to the present embodiment includes the inverter device 140 and the capacitor module 500, and the inverter device 140 has an inverter circuit 144 and a control unit 170. In addition, the inverter circuit 144 is configured to include a plurality of upper and lower arms series circuits 150 (three upper and lower arms series circuits 150, 150, and 150, in the example of FIG. 2). Each upper arm is constituted with an IGBT (insulated gate bipolar transistor) 328 and a diode 156, and each lower arm is constituted with an IGBT 330 and a diode 166. The midpoint (an intermediate electrode) of each series circuits 150 is connected to the motor generator 192 through an AC electric power line (an AC bus bar) 186 via an AC terminal 159. In addition, the control unit 170 includes a driver circuit 174, which drives and controls the inverter circuit 144, and a control circuit 172, which supplies a control signal to the driver circuit 174 through a signal line 176.

The IGBTs 328 and 330 of the upper and lower arms are switching power semiconductor devices and are operated by drive signals from the control unit 170 so as to convert DC electric power supplied from the battery 136 into three-phase AC electric power. The converted electric power is supplied to the armature winding of the motor generator 192.

The inverter circuit 144 is constituted with a three-phase bridge circuit in which the upper and lower arms series circuits 150, 150, and 150 for three phases are electrically connected in parallel between a DC positive terminal 314 and a DC negative terminal 316. The DC positive terminal 314 and the DC negative terminal 316 are electrically connected respectively to the positive electrode side and negative electrode side of the battery 136.

In the present embodiment, the IGBTs 328 and 330 are illustrated as examples of the switching power semiconductor devices. The IGBTs 328 and 330 have collectors 153 and 163, emitters (signal emitter terminals 155 and 165), and gate electrodes (gate electrode terminals 154 and 164). As illustrated, the diodes 156 and 166 are electrically connected respectively between the collectors 153 and 163 and the emitters of the IGBTs 328 and 330. The diodes 156 and 166 respectively have two electrodes, which are cathode and anode electrodes. The cathode electrode is electrically connected to the collectors of the IGBTs 328 and 330, and their anode electrodes are electrically connected respectively to the emitters of the IGBTs 328 and 330 so that the directions from the emitters to the collectors of the IGBTs 328 and 330 are forward directions. A MOSFET (metal-oxide semiconductor field-effect transistor) may be adopted as the switching power semiconductor device, and, in this case, the diodes 156 and 166 become unnecessary.

The upper and lower arms series circuits 150 are provided for each of three phases, corresponding to each phase winding of the armature winding of the motor generator 192. The three upper and lower arms series circuits 150, 150 and 150 works for the U-phase, V-phase, and W-phase for the motor-generator 192, and are connected to the motor-generator 192 through the intermediate electrodes 169 which connect the emitters of the IGBTs 328 with the collectors 163 of the IGBTs 330 via the AC terminals 159. The upper and lower arms series circuits are electrically connected in parallel with each other.

The collectors 153 of the IGBTs 328 of the upper arms are electrically connected (connected via DC bus bars) to the positive-side capacitor electrode of the capacitor module 500 via positive electrode terminals (P terminals) 157 and the emitters of the IGBTs 330 of the lower arms are electrically connected (connected via DC bus bars) to the negative-side capacitor electrode of the capacitor module 500 via negative electrode terminals (N terminals) 158. The intermediate electrodes 169, which are the midpoints of the arms (connecting portions of the emitters of the IGBTs 328 of the upper arms and the collectors of the IGBTs 330 of the lower arms), are electrically connected to the phase windings which correspond to the armature windings of the motor-generator 192 via an AC connector 188.

The capacitor module 500 is to constitute a smoothing circuit which reduces fluctuation in DC voltage generated by switching operation of the IGBTs 328 and 330. The positive and the negative side of the battery 136 are electrically connected to the positive-side capacitor electrode and the negative-side capacitor electrode of the capacitor module 500, respectively, via a DC connector 138. This allows the capacitor module 500 to be electrically connected in parallel to the battery 136 and the upper and lower arms series circuits 150 between the collectors 153 of the upper arm IGBTs 328 and the positive electrode side of the battery 136 and between the emitters of the lower arm IGBTs 330 and the negative electrode side of the battery 136.

The control unit 170 is for operating the IGBTs 328 and 330 and includes the control circuit 172 that generates a timing signal for controlling the timings of switching of the IGBTs 328 and 330 based on information inputted from other control devices sensors, or the like, and a drive circuit 174 that generates a drive signal for switching operations of the IGBTs 328 and 330 based on the timing signal outputted from the control circuit 172.

The control circuit 172 includes a microcomputer for performing processing for calculating the switching timings of the IGBTs 328 and 330. As input information, a target torque value required for the motor-generator 192, a current value supplied from the upper and lower arms series circuit 150 to the armature winding of the motor generator 192, and a magnetic pole position of the rotor of the motor-generator 192 are input to the microcomputer. The target torque value is based upon a command signal outputted from a higher-order control device which is not shown in the figures. The current value is obtained based upon a detection signal outputted from a current sensor 180. The magnetic pole position is obtained based upon a detection signal output from a rotating magnetic pole sensor (not shown in the figures) provided in the motor generator 192. While in the present embodiment, an example in which a three-phase current value is detected will be explained, it may be acceptable to arrange to detect current values of two phases.

The microcomputer in the control circuit 172 calculates current command values of d and q axes of the motor-generator 192 based upon the target torque value, calculates voltage command values of the d and q axes based upon a difference between the calculated current command values of the d and q axes and the detected current values of the d and q axes, and converts the calculated voltage command values of the d and q axes into the voltage command values of the U phase, the V phase, and the W phase based upon the detected magnetic pole position. The microcomputer then generates a pulse-like modulated wave based upon a comparison between a fundamental wave (sine wave) and a carrier wave (triangle wave) based upon the voltage command values of the U phase, the V phase, and the W phase, and outputs the generated modulated wave to the driver circuit 174 as a PWM (pulse-width modulated signal).

When driving the lower arm, the driver circuit 174 amplifies the PWM signal and outputs it to the gate electrode of the IGBT 330 of a corresponding lower arm so as to drive the lower arm. When driving the upper arm, it amplifies the PWM signal after having shifted the reference potential level of the PWM signal to the reference potential level of the upper arm and outputs it to the gate electrode of the IGBT 328 of a corresponding upper arm so as to drive the upper arm. As a result, switching of each of the IGBTs 328 and 330 is operated based upon the input drive signal.

In addition, the control unit 170 performs abnormality detection (over current, over voltage, over temperature, and the like) so as to protect the upper and lower arms series circuit 150. For this purpose, sensing information is input to the control unit 170. For instance, information on current flowing through the emitter of each of the IGBTs 328 and 330 is inputted from emitter electrode terminals 155 and 165, which are for monitoring signals, of each of the arms to the corresponding driving unit (IC). Based upon this, the driving unit (IC) performs over current detection, and if it has been detected, stops the switching operation of the corresponding IGBTs 328 and 330, and protects the corresponding IGBTs 328 and 330 from the over current. Information on temperature at the upper and lower arm series circuit 150 is inputted to the microcomputer from a temperature sensor (not shown in the figures) provided in the upper and lower arm series circuit 150. In addition, information on voltage at the DC positive electrode side of the upper and lower arm series circuit 150 is inputted to the microcomputer. Based upon those pieces of information, the microcomputer performs over temperature detection and over voltage detection and, if over temperature or over voltage has been detected, stops the switching operations of all of the IGBTs 328 and 330, and protects the upper and lower arm series circuit 150 (and thus a semiconductor module including the circuit 150) from the over temperature or the over voltage.

Operations of conduction and interruption of the IGBTs 328 and 330 of the upper and lower arms of the inverter circuit 144 are switched in a fixed order, and the current at the stator winding of the motor generator 192 during the switching flows through a circuit constituted with the diodes 156 and 166.

As illustrated, the upper and lower arms series circuit 150 is provided with the positive terminal (P terminal) 157, the negative terminal (N terminal) 158, the AC terminal 159 from the intermediate electrode 169 of the upper and lower arms, the signal terminal (signal emitter terminal) 155 of the upper arm, the gate electrode terminal 154 of the upper arm, the signal terminal (signal emitter terminal) 165 of the lower arm, and the gate electrode terminal 164 of the lower arm. In addition, the power conversion device 200 includes the DC connector 138 on the input side and the AC connector 188 on the output side, and is connected to the battery 136 and the motor-generator 192 via the connectors 138 and 188, respectively. In addition, the power conversion device may have a circuit configuration in which two upper and lower arms series circuits are connected in parallel for each phase as a circuit generating output of each phase of the three-phase AC to be output to the motor-generator.

In FIG. 3 to FIG. 7, a reference numeral 200 represents the power conversion device, a reference numeral 10 represents an upper case, a reference numeral 11 represents a metal base plate, a reference numeral 12 represents the housing, a reference numeral 13 represents the cooling water inlet pipe, a reference numeral 14 represents the cooling water outlet pipe, a reference numeral 420 represents a cover, a reference numeral 16 represents a lower case, a reference numeral 17 represents an AC terminal case, a reference numeral 18 represents an AC terminal, a reference numeral 19 represents a cooling water flow path, and a reference numeral 20 represents a control circuit board which holds the control circuit 172. A reference numeral 21 represents a connector for external connection, and a reference numeral 22 represents a drive circuit board which holds the driver circuit 174. A reference numeral 300 represents a power module (semiconductor module unit), two of which are provided, each of which has the built-in inverter circuit 144. A reference numeral 700 represents a flat laminated bus bar, a reference numeral 800 represents an O-ring, a reference numeral 304 represents a metal base, a reference numeral 188 represents the AC connector, a reference numeral 314 represents the DC positive terminal, a reference numeral 316 represents the DC negative terminal, a reference numeral 500 represents the capacitor module, a reference numeral 502 represents a capacitor case, a reference numeral 504 represents a positive capacitor terminal, a reference numeral 506 represents a negative capacitor terminal, and a reference numeral 514 represents a capacitor cell.

Figure 3:
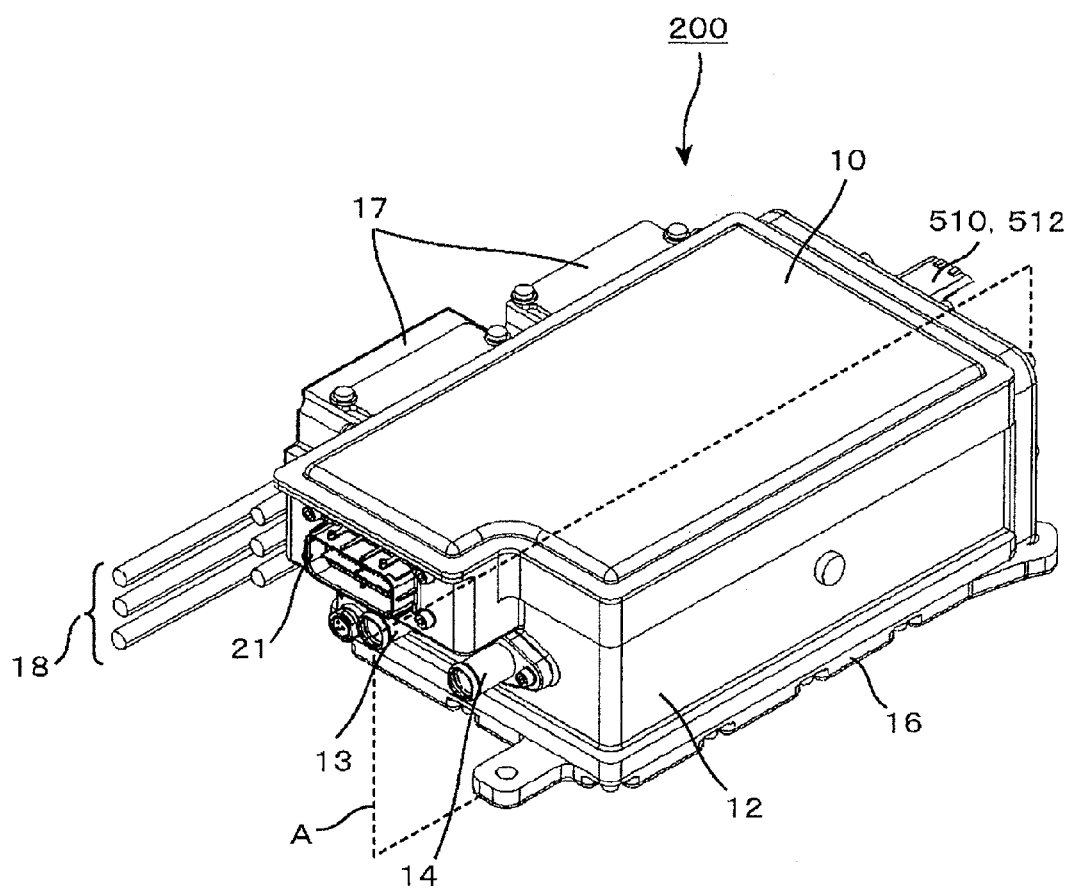
FIG. 3 is a perspective view showing an appearance of a power conversion device.

FIG. 3 shows an external perspective view of the whole structure of the power conversion device according to an embodiment of the present invention. The external shape of the power conversion device 200 according to the present embodiment is constituted with the housing 12 whose upper surface or bottom surface is substantially rectangular, the cooling water inlet pipe 13 and the cooling water outlet pipe 14 provided on one of outer circumferences on the short side of the housing 12, the upper case 10 for covering an upper opening of the housing 12, and the lower case 16 for covering a lower opening of the housing 12, which are connected together to form the power conversion device 200. The shapes shown with bottom view or the upper view of the housing 12 is formed into substantially rectangular in shape so as to be mounted on a vehicle with ease and produced with ease.

Two sets of the AC terminal cases 17 for assisting connection with the motor-generators 192 and 194 are provided on the outer circumference of the long side of the power conversion unit 200. The AC terminals 18 allows therethrough the power module 300 to be electrically connected with the motor-generators 192 and 194 and alternating current output from the power module 300 to be transmitted to the motor-generators 192 and 194.

The connector 21 is connected to the control circuit board 20 housed in the housing 12, and a variety of signals from outside are transmitted therethrough to the control circuit board 20. The battery 136 and the capacitor module 500 are electrically connected with each other via a negative electrode-side connection terminal portion 510 of the DC power supply side and a positive electrode-side connection terminal portion 512 of the DC power supply side. In the present embodiment, the connector 21 is provided on one side of the outer circumference surface of the short side of the housing 12. On the other hand, the negative electrode-side connection terminal portion 510 of the DC power supply side and the positive electrode-side connection terminal portion 512 of the DC power supply side are provided on the outer circumference surface of the short side opposite to the surface on which the connector 21 is provided. In other words, the connector 21 and the negative electrode-side connection terminal portion 510 of the DC power supply side are separated. This allows the noise which enters the housing 12 through the negative electrode-side connection terminal portion 510 of the DC power supply side and then travels to the connector 21 to be reduced, thereby improving controllability of the motor by the control circuit board 20.

Figure 4:
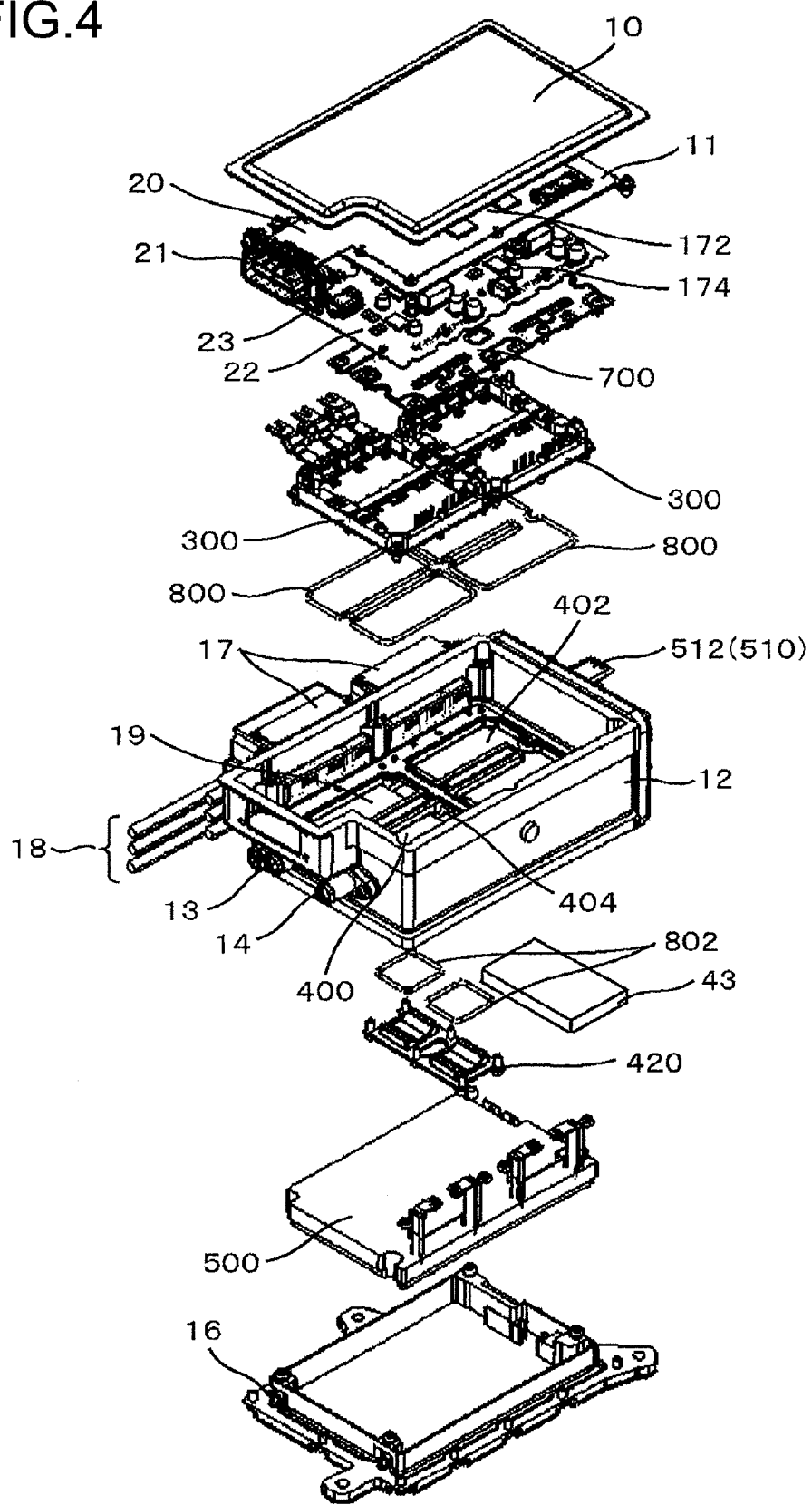
FIG. 4 is an exploded perspective view showing the internal structure of the power conversion device.

FIG. 4 is an exploded perspective view of the whole structure of the power conversion device according to an embodiment of the present invention, showing each constituting component.

As shown in FIG. 4, the cooling water flow path 19 is provided in the middle of the housing 12, and two pairs of openings 400 and 402 are formed along the flow direction above the cooling water flow path 19. Two power modules 300 are fixed on the upper side of the cooling water flow path 19 so that each pair of the openings 400 and 402 is covered with a power module 300. Each of the power modules 300 is provided with a fin 305 for heat dissipation, which protrudes into the flow of cooling water in the openings 400 and 402 of the cooling water flow path 19.

An opening 404 is formed on the lower side of the cooling water flow path 19 for easier aluminium casting, and the opening 404 is covered with the cover 420. The inverter device 43 for auxiliaries is provided on the lower side of the cooling water flow path 19. Within the inverter device 43 for auxiliaries, a circuit similar to the inverter circuit 144 shown in FIG. 2 is installed, and a power module including power semiconductor devices similar to those constituting the inverter circuit 144 is provided. The inverter device 43 for auxiliaries is fixed on the lower side of the cooling water flow path 19, whereby the surface of a heat dissipation metal of the power module installed therein is faced to lower side of the cooling water flow path 19. In addition, the O-ring 800 for sealing is provided between the power module 300 and the housing 12, and furthermore an O-ring 802 is provided between the cover 420 and the housing 12. While an O-ring is used as a sealing material in the present embodiment, a resin material, a liquid seal, packing, or the like may be used in place of the O-ring, and, in particular, a use of a liquid seal can improve assemblability of the power conversion unit 200.

In addition, the lower case 16 for heat dissipation is provided below the cooling water flow path 19, and in the lower case 16 the capacitor module 500 is installed, whereby the heat dissipation surface of the capacitor module 500 case made from a metal material is fixed to the to the surface of the lower case 16, facing to this surface of the lower case. This structure allows efficient cooling to be achieved using the top and bottom surfaces of the cooling water flow path 19, thereby leading to reduction in the size of the entire power conversion unit.

The cooling water flows through the cooling water flow path 19 via the cooling water inlet and outlet pipes 13 and 14 so as to cool heat dissipation fins provided to the two power modules 300 placed side by side, thereby cooling the entire two power modules 300. The inverter device 43 for auxiliaries, which is provided beneath the cooling water flow path 19, is cooled at the same time.

In addition, the housing 12, in which the cooling water flow path 19 is provided, is cooled so as to cool the lower case 16, which is provided under the housing 12, is cooled, and, due to this cooling, heat of the capacitor module 500 is thermally conducted to the cooling water through the lower case 16 and the housing 12, thereby cooling the capacitor module 500.

A laminated conductor plate 700 for electrically connecting the power modules 300 with the capacitor module 500 is positioned above the power modules 300. The laminated conductor plate 700 is designed to be wide in the width direction of the two power modules 300, straddling the two power modules 300. In addition, the laminated conductor plate 700 is constituted with a positive electrode-side conductor plate 702, which is connected with a positive electrode-side terminal of the capacitor module 500, a negative electrode-side conductor plate 704, which is connected with a negative electrode-side terminal thereof, and an insulation member disposed between the positive electrode-side terminal and the negative electrode-side terminal. This enables the layer area of the laminated conductor plate 700 to be increased, thereby reducing parasitic inductance from the power modules 300 to the capacitor module 500. In addition, since, after the one laminated conductor plate 700 is placed on the two power module 300, the laminated conductor plate 700, the power modules 300, and the capacitor module 500 can be electrically connected, the number of assembly steps can be reduced even for a power conversion device including two power modules 300.

Figure 2:
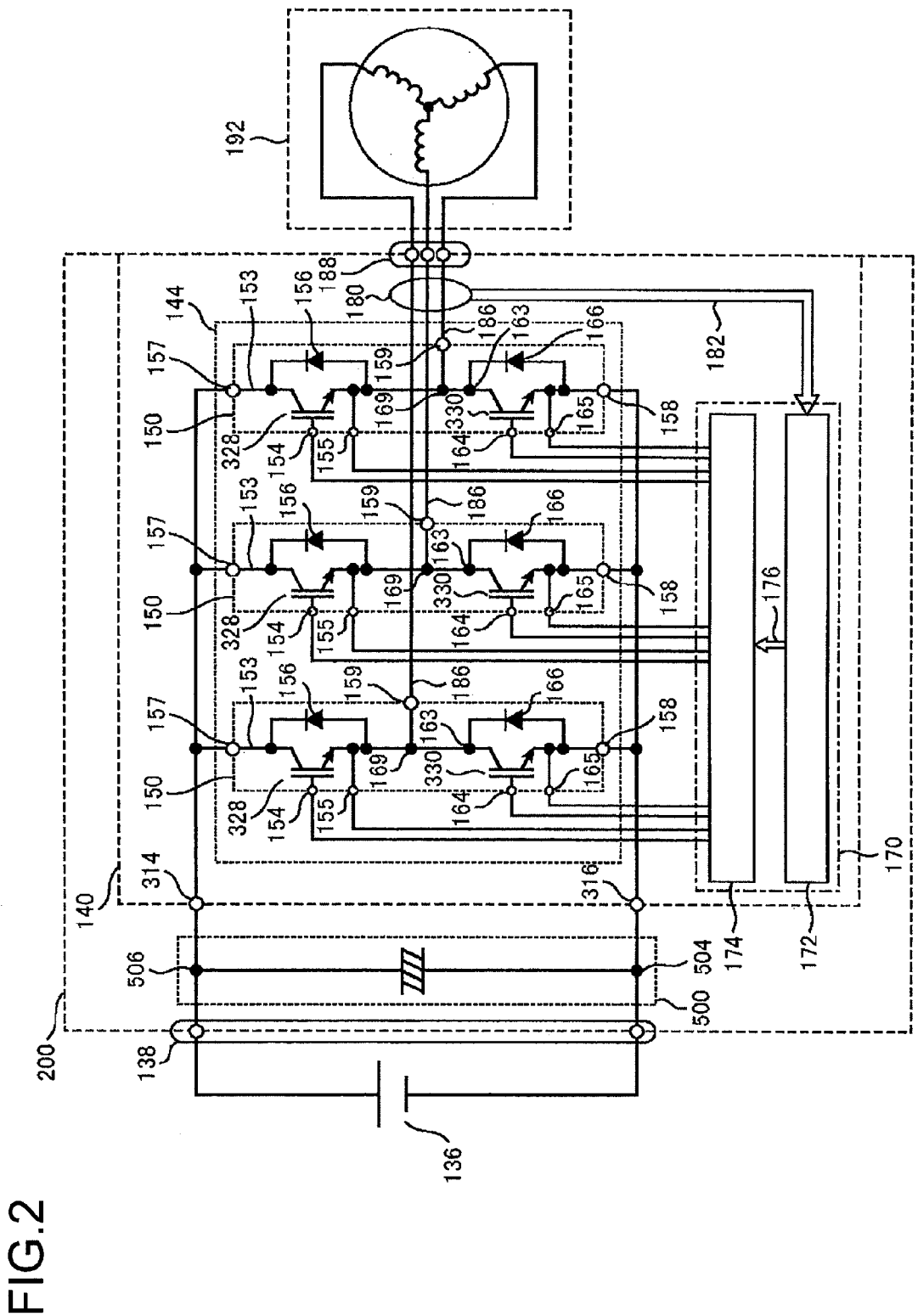
FIG. 2 is a diagram explaining the electrical circuit configuration of an inverter device.

The control circuit board 20 and the drive circuit board 22 are arranged over the laminated conductor plate 700, the driver circuit 174, shown in FIG. 2, is arranged on the drive circuit board 22, and the control circuit 172 which includes a CPU shown in FIG. 2 is arranged on the control circuit board 20. In addition, a metal base plate 11 is disposed between the drive circuit board 22 and the control circuit board 20. The metal base plate 11 functions as an electromagnetic shield for a group of circuits arranged on the both boards 22 and 20, and works to dissipate heat generated by the drive circuit board 22 and the control circuit board 20 and to cool them. Thus, the power conversion device can be efficiently cooled in a small space and the whole power conversion device can be reduced in size by providing the cooling water flow path 19 in the center of the housing 19, arranging the power modules 300 for driving the vehicle on one side of the flow path 19, and arranging the power module 43 for auxiliaries on the other side. Further, the main structure of the cooling water flow path 19 in the center of the housing is integrally produced with the housing 12 with aluminium casting so as to have an effect to increase mechanical strength of the housing 12, in addition to its cooling effect. In addition, aluminium casting allows the housing 12 and the cooling water flow path 19 to have an integrated structure, thereby improving thermal conductivity and cooling efficiency.

The drive circuit board 22 is provided with an interboard connector 23 for connection with the circuits on the control circuit board 20 through the metal board 11. In addition, the control circuit board 20 is provided with the connector 21 for external electrical connection. Via the connector 21 the signal communication with external of the power conversion device, for example with a lithium battery module mounted on the vehicle, e.g., the battery 136, through which signals indicating battery status or charging status of the lithium battery are sent from the lithium battery module. The interboard connector 23 is provided for transferring signals to and from the control circuit 172 held on the control circuit board 20. A signal line 176 shown in FIG. 2, although not shown in FIG. 4, is provided. A switch timing signal for the inverter circuit is transmitted from the control circuit board 20 to the drive circuit board 22 through the signal line 176 and the interboard connector 23, and a gate drive signal, which is a drive signal, is generated at the drive circuit board 22 and applied to each of the gate electrodes of the power module.

The upper case 10 and the lower case 16 are fixed to the housing 12, for example, with screws or the like, so as to seal the openings, formed at an upper part and a lower part of the housing 12. The cooling water flow path 19 is formed in the center of the housing 12. The power module 300 and the cover 420 are fixed to the cooling water flow path 19. The cooling water flow path 19 is thus formed and then tested for water leak. After passing the test, boards and the capacitor module 500 are attached through the upper and lower openings of the housing 12. By the structure in which the cooling water flow path 19 is provided in the center and necessary fixing works of components are done from the upper and lower openings of the housing 12, the productivity is greatly enhanced. In addition, the construction of cooling water flow path 19 is first completed and tested, and then other components are to be fixed, thereby improving productivity and reliability.

Figure 5:
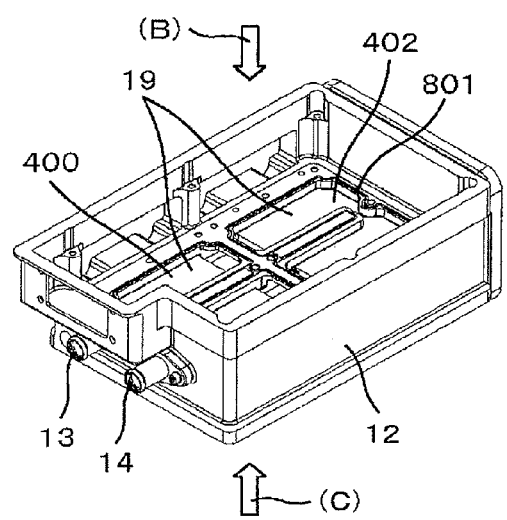
FIG. 5 is a view of a housing of aluminum casting having a cooling water flow path, to which a cooling water inlet pipe and an outlet pipe are provided, where (a) is a perspective view of the housing, (b) is a top view of the housing, and (c) is a bottom view of the housing.
Figure 5:
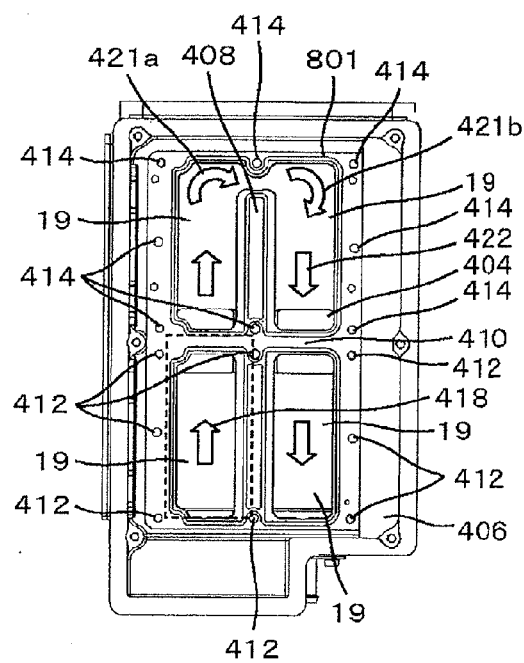
Figure 5:
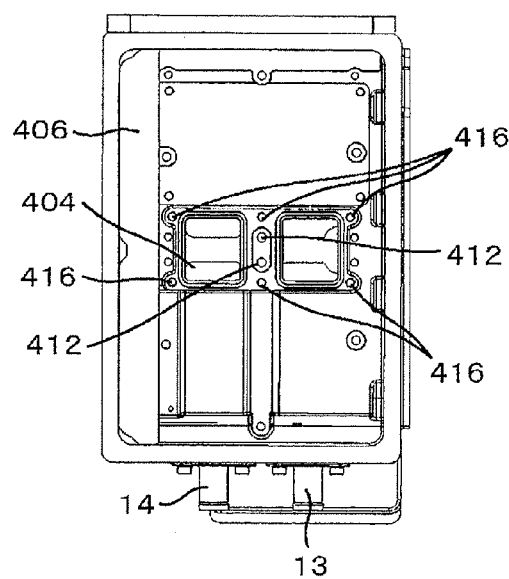

FIG. 5 is a view of the housing 12 of aluminium cast having the cooling water flow path 19 is formed, to which the cooling water inlet pipe and the outlet pipe are provided. FIG. 5(A) is a perspective view of the housing 12, FIG. 5(B) is a top view of the housing 12, and FIG. 5 (C) is a bottom view of the housing 12. As shown in FIG. 5, the housing 12 and the cooling water flow path 19 formed in the housing 12 are integrally casted. The upper surface and the lower surface of the housing 12 are substantially rectangular. The cooling water inlet pipe 13 for inletting the cooling water is provided on one of the short sides of the housing and the cooling water inlet pipe 14 is provided on the same side.

Via the cooling water inlet pipe 13, the cooling water flows into the cooling water flow path 19, then it further flows along one of the long sides of the rectangle as indicated by an arrow 418, turns in the vicinity just before the other one of the short sides of the rectangle as indicated by arrows 421*a* and 421*b*, flows along the other one of the long sides of the rectangle as indicated by an arrow 422, and flows out from an outlet not shown in the figures. Two openings 400 and 402 are formed along the going direction of the cooling water flow path 19, and another two openings 400 and 402 are formed along its returning direction. The power modules 300 are fixed to each of the openings, and the cooling fin for cooling each of the power modules 300 protrudes into the flow of cooling water in each of the openings. The power modules 300 are fixed side by side along the flow, i.e., the long side of the housing 12. A support part 410 is integrally formed with the housing so that each of the power modules 300 may fully seal the openings of the cooling water flow path 19 with, for instance, the O-ring 800 or the like. The support part 410 is disposed in a substantial center of the housing 12. One of the power modules 300 is fixed to the support part 410 on the side where the inlet and outlet of the cooling water exist, while the other power module 300 is fixed to the support part 410 on the other side where the cooling water turns. Threaded holes 412 shown in FIG. 5(B) are used for fixing the power module 300 on the inlet and outlet side to the cooling water flow path 19. The openings 400 are thus sealed. Threaded holes 414 are used for fixing the power module 300 on the other side to the cooling water flow path 19. The openings 402 are thus sealed. By arranging the power modules 300 in this manner to straddle the both directions of the cooling water flow path 19, the inverter circuit 144 can be integrated with high density on the metal base 304. Therefore, the power modules 300 can be reduced in size, thereby significantly contributing to reduction in the size of the power conversion device 200.

The power module 300 on the inlet and outlet side is to be cooled by both cold cooling water from the cooling water inlet pipe 13, and by the cooling water flowing near the outlet side, which is warmed by a heat-generating component. On the other hand, the power module 300 on the turning side is cooled by cooling water slightly warmed cooling water, and by the cooling water slightly cooler than that near the outlet 403. As a result, the structure of the returning cooling water passage provides an advantage that the two power modules 300 enjoy similar cooling efficiency.

The support part 410 is used for fixing the power module 300 and necessary for sealing the openings 400 and 402. In addition, the support part 410 greatly contribute to reinforce the housing 12. The cooling water flow path 19 has a shape with the turning as described earlier and is provided with a partition wall 408 for separation of the going flow and the returning flow of cooling water. The partition wall 408 is integrally formed together with the support part 410. The partition wall 408 has a function to increase mechanical strength of the housing as well as the function to simply partition the flow path of the going and returning directions. In addition, the partition wall 408 has also a function to transfer the heat between the going and returning passages, and acts to equalize the cooling water temperature flowing through them. A larger difference in temperature between the inlet-side cooling water and the outlet-side cooling water results in more significant non-uniformity in cooling efficiency. Since the partition wall 408 is integrally formed together with the support part 410, the difference in the cooling water temperature is reduced, even though temperature difference to some extent may arise unavoidably.

FIG. 5(C) shows the back side of the cooling water flow path 19. The opening 404 is formed on the back side at a position corresponding to the position where the support part 410 exists. The opening 404 is to improve the yield of the housing 12 manufactured by casting, where the support part 410 is formed integrally with the housing 12. The opening 404 is provided to avoid double structure of the support part 410 and the bottom of the cooling water flow path 19, through which the casting is easily done and productivity is enhanced.

In addition, a through hole 406 is formed on the side portion of the cooling water flow path 19. Electrical components (the power module 300 and the capacitor module 500) placed on the both sides of the cooling water flow path 19 are connected with each other through the through hole 406.

In addition, since the housing 12 can be produced so that the cooling water flow path 19 is integrally formed, casting, or, in particular, aluminium die casting is suited for fabrication of the housing 12.

Figure 6:
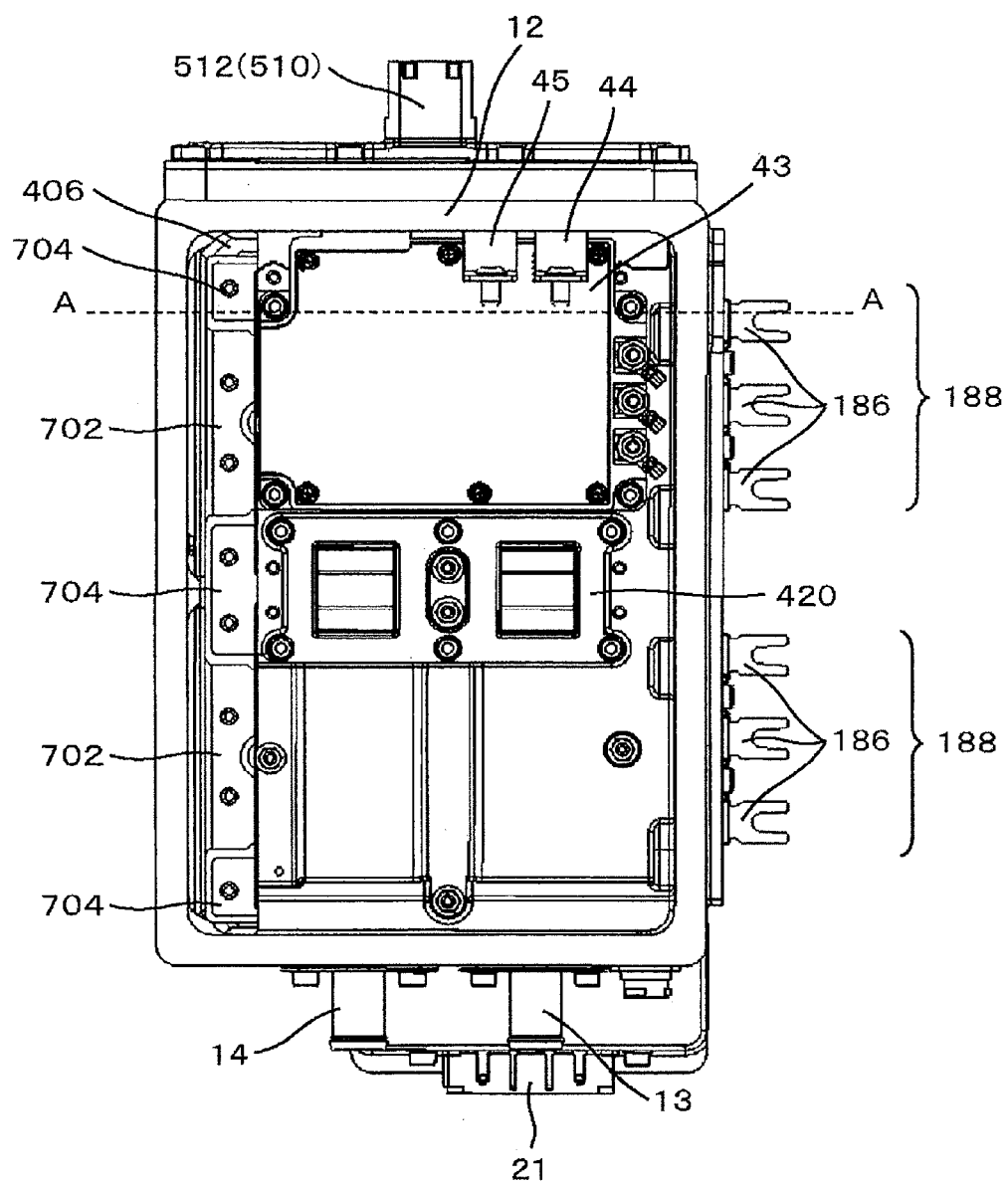
FIG. 6 is a detailed view of the bottom view of the housing.

FIG. 6 shows a state the housing 12 in which the power module 300 is fixed to the upper opening of the cooling water flow path 19 and the cover 420 is fixed to the back side opening thereof. The AC electric power lines 186 and the AC connectors 188 protrude from the housing 12 on one of the long sides of the rectangle of the housing 12.

In FIG. 6, the through hole 406 is formed inside the other long side of the rectangle of the housing 12 and a part of the laminated conductor plate 700 to be connected with the power module 300 is seen through the through hole 406. The inverter device 43 for auxiliaries is disposed in the vicinity of the side of the housing 12 to which the DC positive electrode-side connection terminal portion 512 is connected. In addition, the capacitor module 500 is disposed below the inverter device 43 for auxiliaries (the opposite side of the side where the cooling water flow path 19 exists). A positive terminal 44 for auxiliaries and a negative terminal 45 for auxiliaries protrude downward (the direction in which the capacitor module 500 is disposed) so as to be connected to a positive terminal 532 for auxiliaries and a negative terminal 534 for auxiliaries of the capacitor module 500, respectively. This results in reduced wiring length from the capacitor module 500 to the inverter device 43 for auxiliaries, thereby reducing noise entering the control circuit board 20 from the positive terminal 532 for auxiliaries and the negative terminal 534 for auxiliaries of the capacitor module 500 via the metal housing 12.

In addition, the inverter device 43 for auxiliaries is disposed in a gap between the cooling water flow path 19 and the capacitor module 500, and the inverter device 43 for auxiliaries and the cover 420 are of similar height. Therefore, the inverter device 43 for auxiliaries can be cooled, and an increase in the height of the power conversion device 200 can be suppressed.

In FIG. 6, the cooling water inlet pipe 13 and the cooling water outlet pipe 14 are fixed with screws. A water leak test of the cooling water flow path 19 can be carried out in the state as shown in FIG. 6. After passing this water leak test, the inverter device 43 for auxiliaries is mounted and the capacitor module 500 is mounted.

Figure 7:
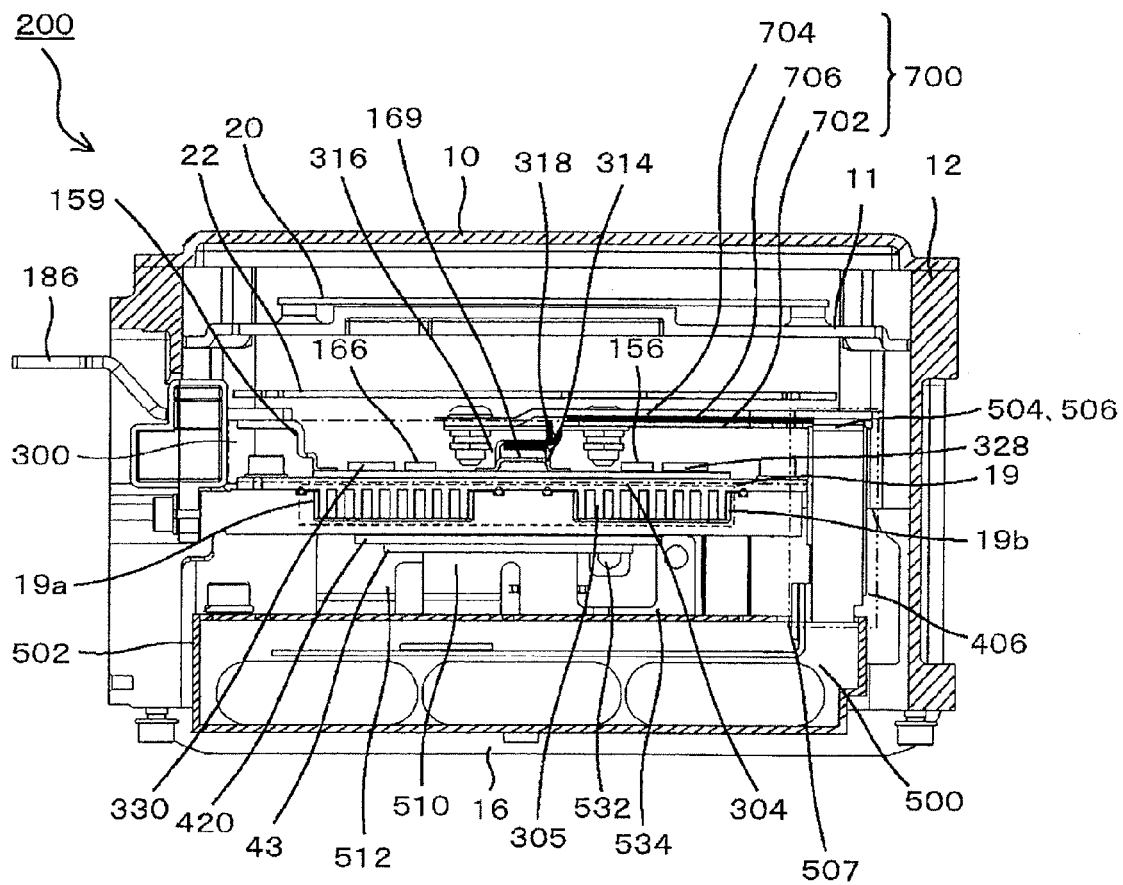
FIG. 7 is an A-A sectional view of FIG. 6.

FIG. 7 is a sectional view (with respect to the A-A cross section of FIG. 6) of the power conversion device 200, and the basic structure has already been described as above with reference to FIG. 3 to FIG. 6.

The cooling water flow path 19 (indicated with dotted line in FIG. 7), which is integrally formed in the housing 12 with aluminum die casting, is positioned at the center as shown in the vertical cross-section of the housing 12. The power modules 300 (indicated with dashed-dotted line in FIG. 7) are placed in the opening formed at the upper side of the cooling water flow path 19. In FIG. 7, the flow path on the left hand side is a going flow path 19a of the cooling water, and the flow path on the left hand side is a returning flow path 19b of this water path. As described above, each of the going path 19a and the returning path 19b is provided with the opening which is covered spanning over both of the going path 19a and the returning path 19b with the metal base 304 for cooling the power module 300. The fin 305 for heat dissipation provided on the metal base 304 protrudes in the opening into the flow of cooling water. And, the inverter device 43 for auxiliaries is fixed to the lower side of the cooling water flow path 19.

The plate-like AC electric power line 186, which is bent around its middle part, is connected at its one end to the AC terminal 159 of the power module 300 and protrudes at the other end from inside the power conversion device 200 to constitute an AC connector. The positive capacitor terminal 504 and the negative capacitor terminal 506 are electrically and mechanically connected to the positive electrode-side conductor plate 702 and the negative electrode-side conductor plate 704, respectively, via the through hole 406 (dashed-two dotted line in FIG. 7). The cooling water flow path 19 is formed in the middle area of the housing 12 with going and returning passages along the long side of the rectangle. The AC connector 188, the positive capacitor terminal 504, and the negative capacitor terminal 506 are extending substantially vertical to the direction of the cooling water flow. Thus the electric wiring is orderly arranged, thereby facilitating the size reduction of the power conversion device 200. Since the positive electrode-side conductor plate 702 and the negative electrode-side conductor plate 704 of the laminated conductor plate 700 and the AC electric power line 186 protrude from the power module 300 and constitute the connecting terminals. Thus the connecting structure is very simple, and the size of the power conversion device is reduced, since no other connection conductor is used. Further, this structure enhances both productivity and reliability.

In addition, the through hole 406 and the cooling water flow path 19 are separated to each other in the structure inside the housing 12, and the connection section of the positive electrode-side conductor plate 702 and the negative electrode-side conductor plate 704 with the positive capacitor terminal 506 and the negative capacitor terminal 504 is arranged inside the through hole 406, thereby improving the reliability.

The power module 300 generating a large amount of heat is fixed on one side of the cooling water flow path 19, and the fin 305 of the power module 300 protrudes in the opening of the cooling water flow path 19 into this water flow path for efficient cooling. The inverter device 43 for auxiliaries generating a heat amount less than the power module 300 is cooled on the other side of the cooling water flow path 19. The capacitor module 500 generating a heat amount less than the inverter device 43 is cooled via the housing 12 and the lower case 16. With such a cooling structure accommodating the heat generation, the cooling efficiency and reliability are improved, and the size reduction of the power conversion device 200 is facilitated.

In addition, since the inverter device 43 for auxiliaries is fixed on the side of the cooling water flow path 19, facing to the capacitor module 500, the capacitor module 500 can be used as a smoothing capacitor with a closest connection to the inverter device 43 for auxiliaries. This short connection allows to reduce inductance due to wiring length.

The drive circuit board 22 on which the driver circuit 174 is arranged is positioned above the power module 300, and the control circuit board 20 is placed above the drive circuit board 22. Between the control circuit board 20 and the drive circuit board 22, a metal base plate 11 for enhancing the effects of heat dissipation and electromagnetic shielding. It is to be noted that the control circuit 172 shown in FIG. 2 is arranged on the control circuit board 20. The power conversion device 200 according to the present embodiment is constructed by fixing the upper case 10 to the housing 12.

Since, as described above, the drive circuit board 22 is positioned between the control circuit board 20 and the power module 300, operation timings of the inverter circuit are transferred from the control circuit board 20 to the drive circuit board 22, and gate signals are generated at the drive circuit board 22 based on the operation timings, and then the gate signals are applied to respective gates of the power module 300. Such an arrangement of the control circuit board 20 and the drive circuit board 22 along the electrical connection facilitates simplification of electric wirings and size reduction of the power conversion device 200. In addition, the drive circuit board 22 is positioned closer to the control circuit board 20 than the power module 300 and the capacitor module 500. Thus, the wiring length from the drive circuit board 22 to the control circuit board 20 is less than the wiring between other components (the power module 300 or the like) and the control circuit board 20. As a result, electromagnetic noise from the portion of the DC positive electrode-side connection terminal portion 512 and electromagnetic noise due to switching operations of the IGBTs 328 and 330 can be prevented from entering the wiring from the drive circuit board 22 to the drive circuit board 20.

The power module 300 is fixed to one side of the cooling water flow path 19, and the inverter device 43 for auxiliaries is fixed to the other side of the cooling water flow path 19 so as to allow the cooling water flow path 19 to cool both the power module 300 and the inverter device 43 for auxiliaries at the same time. In this structure, a better cooling effect is realized because the cooling fin of the power module 300 directly contacts the cooling water flowing in the cooling water flow path 19. In addition, the cooling water flow path 19 cools the housing 12 on which the lower case 16 and the metal base plate 11 are fixed, by which cooling is effected via the lower case 16 and metal plate 11. As the metal case of the capacitor module 500 is fixed to the lower case 16, the capacitor module 500 is cooled via the lower case 16 and the housing 12. Likewise, the control circuit board 20 and the drive circuit board 22 are cooled via the metal base plate 11. In addition, the lower case 16 is made of highly heat-conductive material, through which the heat of the capacitor module 500 is conducted to the housing 19, and is dissipated into the cooling water of the cooling water flow path 19. In addition, the inverter device 43 for auxiliaries with relatively small capacity is placed on the other side that is the side where the lower cover 15 of the cooling water flow path 19 exists. The inverter device 43 for auxiliaries is used for the in-vehicle air conditioner, the oil pump, and other pumps, The heat of the inverter device 43 for auxiliaries dissipated into the cooling water of the cooling water flow path 19 through the inner frame of the housing 12. Such construction that the cooling water flow path 19 is arranged in the middle, with the metal base plate 11 is arranged on one side, and the lower case 16 provided on the other side, allows the components of the power conversion device 200 to be efficiently cooled accommodating to their heat generation amounts. In addition, the components are orderly arranged inside the power conversion device 200, thereby size reduction is facilitated.

As the heat dissipator for the power conversion device primarily functions the cooling water flow path 19, and also other cooling elements include the metal base plate 11, i.e. (the metal base plate 11 is provided for heat dissipation. The metal base plate 11 has a function as an electromagnetic shield, as well as a function of conducting the heat of the control circuit board 20 and the drive circuit board 22 to the housing 12 that is cooled by the cooling water of the cooling water flow path 19.

Thus, in the power conversion device according to the present embodiment, the heat dissipation body is constructed as a stacked structure of three blocks, i.e., the metal base plate 11, the cooling water flow path 19, and the lower case 16. These heat dissipating blocks are arranged in a stack with each block positioned adjacent to corresponding heat generating unit (the power module 300, the control circuit board 20, the drive circuit board 22, and the capacitor module 500). In the middle of the stacked structure, by which structure the heat conducted through the metal base plate 11 and the lower case 16 is further dissipated into the cooling water of the cooling water flow path 19, the cooling water flow path 19 as the major heat dissipater is provided. The metal base plate 11 and the lower case 16 dissipate the heat into the cooling water of the cooling water flow path 19 via the housing 12. The three heat dissipating blocks (the cooling water flow path 19, the metal base plate 11, and the lower case 16) are housed in the housing 12, which contribute to improve heat dissipation performance, and to reducing the vertical size and overall size of the power conversion device.

In addition, the cylindrical capacitor element 514 according to the present embodiment is prepared to have its sides pressed from both sides and the cross-section thereof being elliptical in order to increase the integration efficiency. In the present embodiment, the lateral side having a longer diameter of its elliptical-shaped cross-section is placed facing the bottom of the capacitor case 502. This achieves a larger contact area of the capacitor element 514 with the capacitor case 502, and allows the capacitor element 514 to be efficiently cooled as well as reducing the vertical size of the power conversion device 200.

As described in the present embodiment, where the capacitor module 500 is placed in the lowest position of the power conversion device 200, the heat generated by the capacitor element 514 can be dissipated to outside through the capacitor case 502 and the lower case 16, and therefore the arrangement of the capacitor element 514 is particularly effective for improving heat dissipation.

Figure 8:
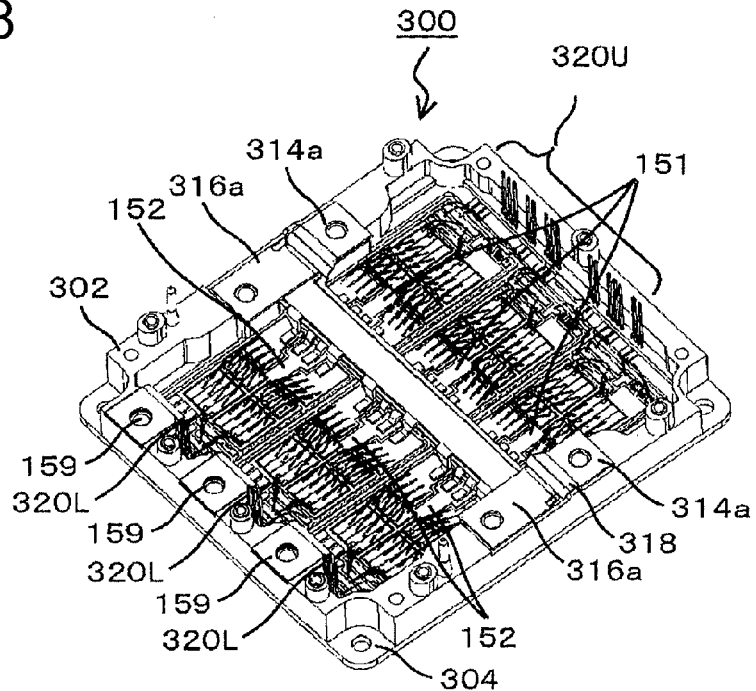
FIG. 8 is a view showing a power module, where (a) is an upper perspective view and (b) is a top view.
Figure 8:
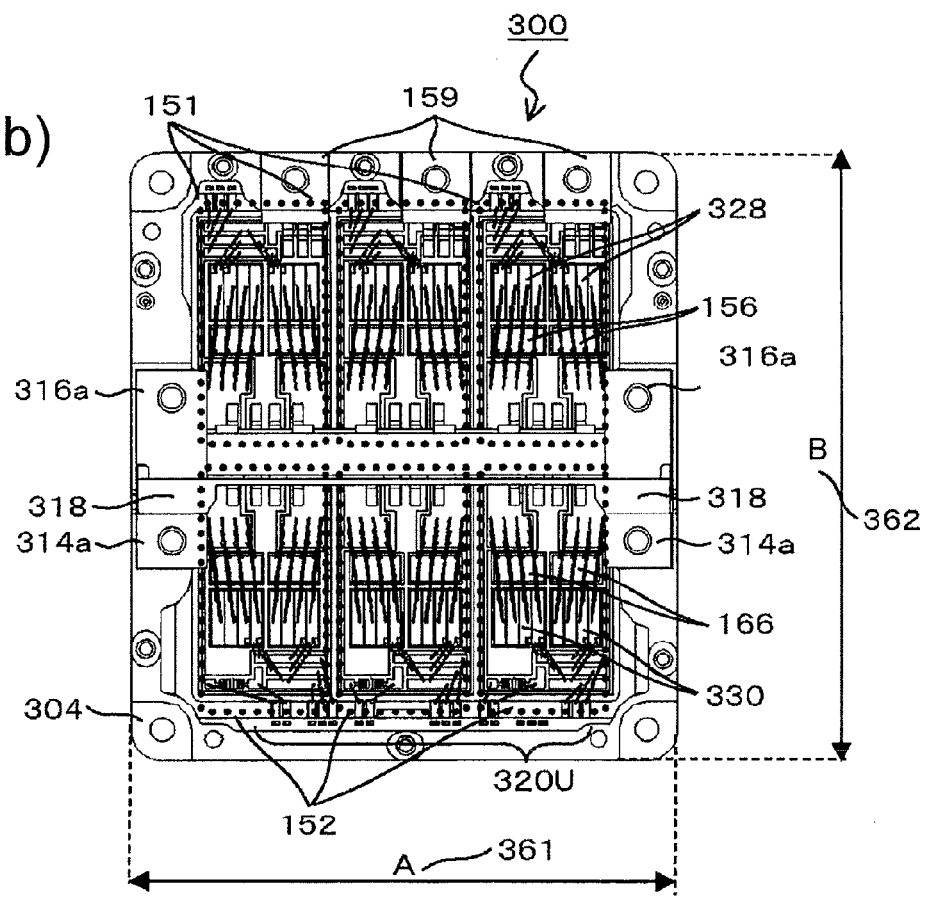
Figure 9:
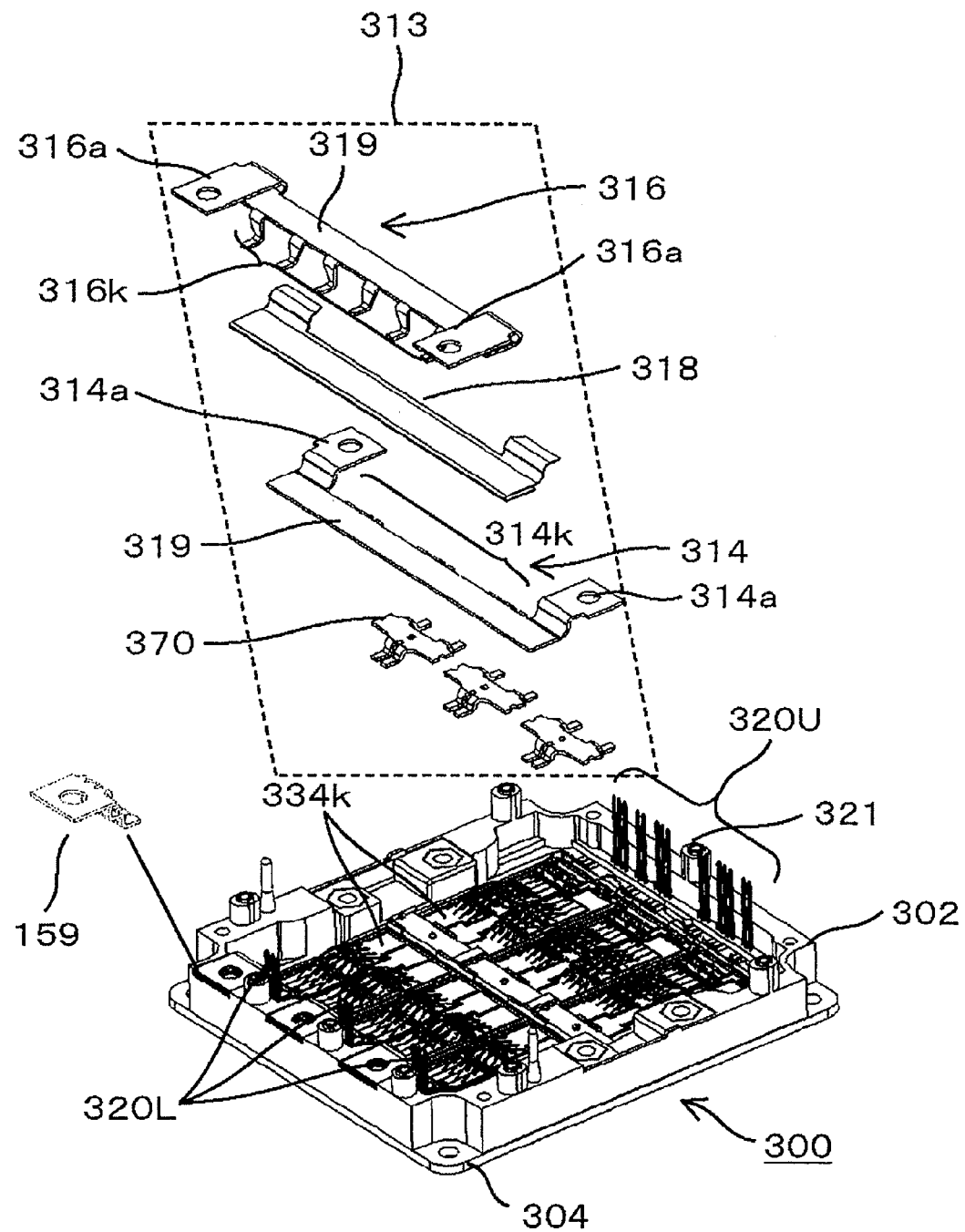
FIG. 9 is an exploded perspective view of a DC terminal of the power module 300 according to the present embodiment.
Figure 10:
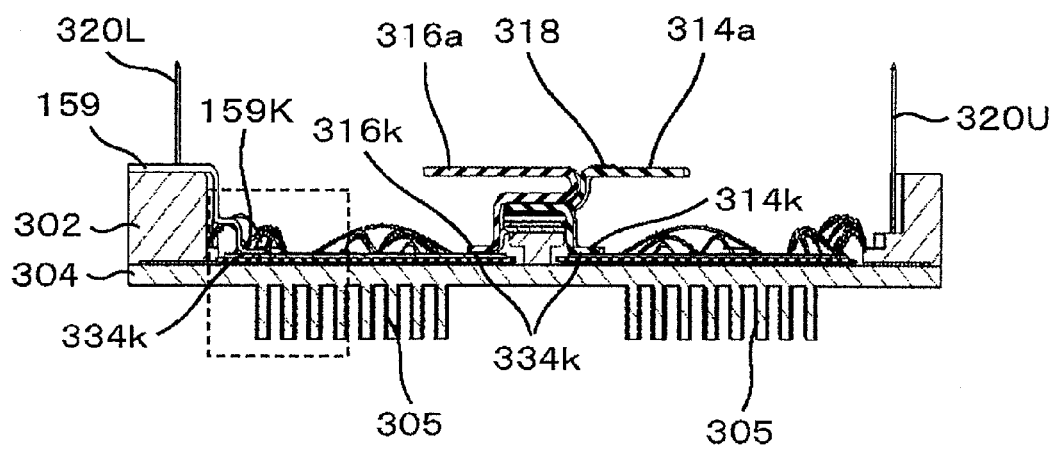
FIG. 10 is a partially cut off sectional view of the power module case 302, showing the structure of a DC bus bar clearly.
Figure 10:
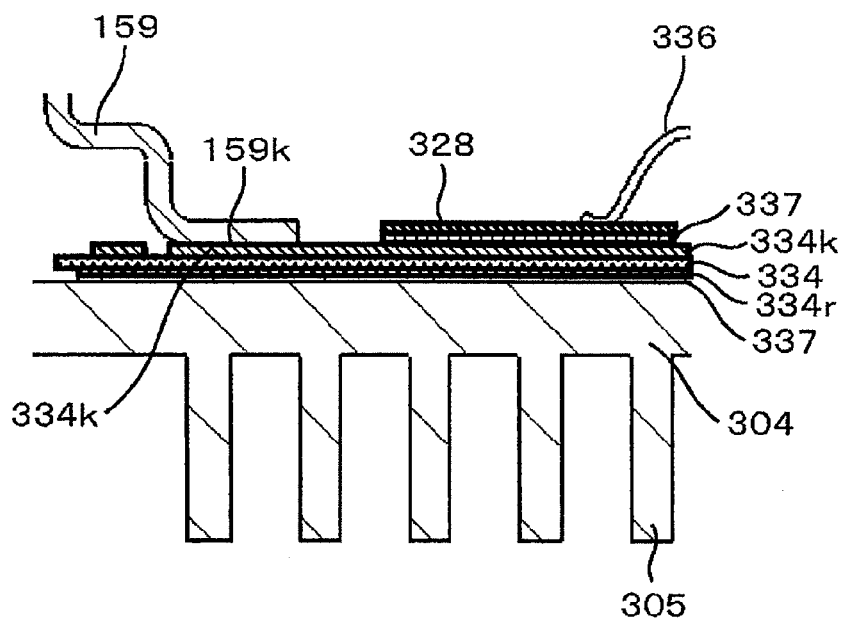

FIG. 8(*a*) is an top perspective view of the power module 300 according to the present embodiment and FIG. 8(*b*) is a top view of the power module 300. FIG. 9 is an exploded perspective view of the DC terminal of the power module 300 according to the present embodiment. FIG. 10 is a sectional view of a power module case 302 where only interested parts are shown and others are removed, for clearly showing the structure of the DC bus bar. FIG. 9(*a*) is an illustration of the metal base 304 and one of the three upper and lower arm series circuits, which are the components of the power module 300. FIG. 9(*b*) is an exploded perspective view of the metal base 304, a circuit wiring pattern, and an insulation substrate board 334.

The reference numeral 302 represents the power module case, the reference numeral 304 represents the metal base, the reference numeral 305 represents the fin (refer to FIG. 10), the reference numeral 314 represents the DC positive terminal, the reference numeral 316 represents the DC negative terminal, a reference numeral 318 represents insulation paper (refer to FIG. 9), reference numerals 320U/320L represent control terminals of the power module, the reference numeral 328 represents the IGBT for the upper arm, the reference numeral 330 represents the IGBT for the lower arm, the reference numerals 156/166 represent the diodes, the reference numeral 334 represents the insulation substrate board (refer to FIG. 10), a reference numeral 334*k* represents a circuit wiring pattern (refer to FIG. 10) on the insulation substrate board 334, and a reference numeral 334*r* represents a circuit wiring pattern 337 (refer to FIG. 10) beneath the insulation substrate board 334.

The power module 300 is roughly divided into the semiconductor module unit including wiring in the power module case 302 made of, for example, resin material, the metal base 304 made of metallic material such as Cu, Al, or AlSiC, and into the connecting terminals (the DC positive terminal 314, the control terminal 320U, and the like) for external connection. The power module 300 includes connection terminals for external connection, such as the AC terminals 159 of U, V, and W phases for connecting to the motor, and the DC positive terminals 314 and the DC negative terminals 316 for connecting to the capacitor module 500.

In addition, the semiconductor module unit is provided with the IGBTs 328 and 330 of the upper and lower arms, the diode 156/166, and the like provided on the insulation substrate board 334, and is protected by resin or silicone gel (not shown in the figures). The insulation substrate board 334 may be a ceramic substrate board, and moreover a thin insulation sheet.

FIG. 8(*b*) shows an actual arrangement of the upper and lower arms series circuit on a highly heat-conductive ceramic fixed on the metal base 304, and also explains their functions. The IGBTs 328 and 330 shown in FIG. 8(*b*) and diodes 327 and 332 constitute the upper arm and the lower arm, where each arm with two chips of IGBTs and two chips of diodes are connected in parallel, thereby increasing current capacity for applying current to the upper and lower arms.

As shown in FIG. 9, a DC terminal 313 to be installed in the power module 300 is constructed as a laminated structure with the DC negative terminal 316, the DC positive terminal 314, and an insulation paper 318 (dotted line in FIG. 9) between these terminals. Further, the end portions of the DC negative terminal 316 and also the end portions of the DC positive terminal 314 are respectively folded in reverse directions, so as to form respectively a negative electrode connecting portion 316*a* and a positive electrode connecting portion 314*a* for electrical connection between the laminated conductor plate 700 and the power module 300. By use of two connection portions 314*a* (or 316*a*) for connecting to the laminated conductor plate 700 the average distances from the negative electrode connecting portion 316*a* or from the positive electrode connecting portion 314*a* to the three upper and lower arms series circuits become substantially equal, thereby reducing variation of parasitic inductance in the power module 300.

Thus, the DC positive terminal 314, the insulation paper 318, and the DC negative terminal 316 are assembled by overlaying them, which has a structure that the negative electrode connection section 316*a* and the positive electrode connection section 314*a* are bent in opposite directions to each other. The insulation paper 318 is curved along the negative electrode connection section 316*a* so as to ensure the creepage distance for insulation of the terminals of the positive electrode and the negative electrode. If the insulation paper 318 is required to be heat-resistant, a composite sheet of polyimide, meta-aramid fiber, polyester with improved tracking resistance, and the like is used. Further, two sheets are layered for increased reliability in order to prevent defects such as pinhole. In addition, in order to prevent the insulation paper 318 from tearing or splitting, the corner is rounded and the roll-over side of punching is arranged to face the insulation paper so that the edge of the terminal does not contact the insulation paper. While in the present embodiment, an insulation paper is used for insulator, as an alternative it is also acceptable that an insulating material is coated on the terminals. In order to reduce parasitic inductance, for instance, in case of a power module of a withstanding voltage 600V, the distance between the positive electrode and the negative electrode is arranged to be equal to or less than 0.5 mm, and the thickness of the insulation paper chosen to be equal to or less than half of that distance.

In addition, the DC positive terminal 314 and the DC negative terminal 316 include connection end portions 314K and 316K for connecting to a circuit wiring pattern 334K. Each of the phases (U, V, and W phases) is provided with two connection end portions 314K and two connection end portions 316K. This allows the DC positive terminal 314 and the DC negative terminal 316 to be connected to the circuit wiring pattern through which two small-loop current paths are formed in each arm of the phases, as described later. In addition, each of the connection end portions 314K and 316K, protruding in the direction to the circuit wiring pattern 334K, is bent at its top end portion so as to form a contacting surface to the circuit wiring pattern 334K. The connection end portions 314K and 316K are connected with the circuit wiring pattern 334K by soldering or the like, or connected by ultrasonic welding which achieves a direct metal to metal connection.

The power module 300, in particular the metal base 304, expands and contracts with temperature cycles. This expansion and contraction may cause crack or fracture at the connecting portions of the connection end portions 314K and 316K with the circuit wiring pattern 334K. Then, in the power module 300 according to the present embodiment, as shown in FIG. 9, a flat overlaid portion 319, formed by overlaying the DC positive terminal 314 and the DC negative terminal 316 is arranged to be in substantially parallel to the plane of the metal base 304 of the side on which the insulation substrate board 334 is mounted. Due to this structure, thereby enabling warpage movements of the laminated flat surface 319 corresponding to the warpage of the metal base 304 caused by the above-described expansion and contraction. Because of this, the rigidity of the connection ends 314K and 316K, which are integrally formed with the flat overlaid portion 319, can be made less, relative to warpage of the metal base 304. This can relieve vertically applied stress at the joint area of the connection ends 314K and 316K with the circuit wiring pattern 334K, thereby preventing the joint area from cracking or fracturing.

It is to be noted that the flat overlaid portion 319 according to the present embodiment has a lateral length of 130 mm and a depth of 10 mm, which depth is designed larger, so as to enable the warpage movements corresponding to the warpage in both the width direction and the depth direction of the metal base 304. In addition, the flat overlaid portion 319 of each of the DC positive terminal 314 and the DC negative terminal 316 is set to 1 mm thick, which is relatively thin, for easy warpage movements.

As shown in FIG. 10, the metal base 304 includes the fin 305 on the other side of the insulation substrate board 334 so as to be immersed into the cooling water in the cooling water flow path for efficient cooling. And, on the metal base 304 the IGBTs and the diodes constituting the inverter circuit are mounted on one side, and the resin power module case 302 is provided on the outer circumference of the metal base 304. The metal base 304 is provided with the fin 305 by brazing on the other side thereof, or the metal base 304 and the fin 305 are integrally formed by forging. By integrally forming the metal base 304 and the fin 305 by forging, it becomes possible to improve the productivity of the power module 300 and to improve the thermal conductivity from the metal base 304 to the fin 305, thereby improving heat dissipation performance for the IGBTs and the diodes. In addition, a Vickers hardness of equal to or greater than 60 is selected for the metal base 304, so as to suppress ratcheting deformation of the metal base 304 caused by temperature cycles and improve sealing performance of the metal base 304 and the housing 12. In addition, as shown in FIG. 10(a), the fin 305 is provided corresponding to each of the upper and lower arms, and these fins 305 protrude into the water path in the openings of the going/returning cooling water flow path 19. The metal surface around the fin 305 of the metal base 304 is used for sealing the openings provided in the cooling water flow path 19.

It is to be noted that while the fin 305 of the present embodiment is pin-shaped, a straight-shaped fin formed along the flow direction of the cooling water may be adopted as another embodiment. A straight-shaped fin 305 allows to reduce the water flowing pressure, and, on the other hand, a pin-shaped fin allows the cooling efficiency to be improved.

The insulation substrate board 334 is fixed on one side of the metal base 304, and chips of the IGBT 328 for the upper arm, the diode 156 for the upper arm, the IGBT 330 for the lower arm, and the diode 166 for the lower arm are fixed on the insulation substrate board 334 with a solder 337.

As shown in FIG. 11(a), the upper and lower arms series circuit 150 includes an upper arm circuit 151, a lower arm circuit 152, a terminal 370 for connecting the upper and lower arms circuits 151 and 152, and the AC terminal 159 for outputting AC power. And, as shown in FIG. 11(b), the upper arm circuit 151 includes the insulation substrate board 334 on which the circuit wiring pattern on the metal base 304, and the IGBT 328 and the diode 156 on this circuit wiring pattern 334k.

The IGBT 328 and the diode 156 are connected by soldering on their under side with the circuit wiring pattern 334k. The insulation substrate board 334, on which the circuit wiring pattern is formed, forms a so-called solid pattern, which is patternless, on the opposite side (back side) of the circuit wiring pattern side. The solid pattern on the back side of the insulation substrate board and the metal base 304 are connected by soldering. The lower arm circuit 152, similar to the upper arm, includes the insulation substrate board 334 placed on the metal base 304, the circuit wiring pattern 334k wired on the insulation substrate board 334, and the IGBT 330 and the diode 166 mounted on the circuit wiring pattern 334k.

Further, electrodes on the back side of the IGBT 330 and the diode 166 are also connected by soldering on their under side with the circuit wiring pattern 334k. It is to be noted that each of the arms of each of the phases in the present embodiment is constituted with two sets of circuit units connected in parallel, where in each unit an IGBT 328 and a diode 156 are connected in parallel. The number of sets of the circuits to be connected in parallel is determined in accordance with the current amount applied to the motor 192. If a current higher than the current applied to the motor 192 in the present embodiment is necessary, each of the arms of each of the phases is constituted by connecting in parallel three or more sets of the circuit sections. On the other hand, if the motor can be driven on lower current, each of the arms of each of the phases is constituted merely with a single set of the circuit sections.

The current flow path of the power module 300 will be explained with reference to FIG. 11(b). The current flowing through the upper arm circuit of the power module 300 flows through the following path: (1) from the DC positive terminal 314 (not shown in the figure) to a connection conductor 371U, (2) from the connection conductor 371U via an connection conductor 372U provided for the device to the electrodes of one side (electrodes of the side connected to the connection conductor 372U for the device) of the IGBT 328 for the upper arm and the diode 156 for the upper arm, (3) from the electrodes of the other side of the IGBT 328 for the upper arm and the diode 156 for the upper arm through a wire 336 to a connection conductor 373U, (4) from the connection conductor 373U via connection portions 374U and 374D of the connection terminal 370 to a connection conductor 371D. It is to be noted that as described above, the upper arm is constituted with two sets of the circuit units connected in parallel, where in each unit the IGBT 328 and the diode 156 are connected in parallel. Thus, in the current flow path of the above (2), the current is divided in two flows at the element-side connection conductor 372U, and the two divided currents flow respectively into the two sets of circuit units.

Similarly, the current flowing through the lower arm circuit of the power module 300 flows through the following path: (1) from the connection conductor 371D via an connection conductor 372D provided for the device to the electrodes of one side (electrodes of the side connected to the connection conductor 372D for device) of the IGBT 330 for the lower arm and the diode 166 for the upper arm, (2) from the electrodes of the other side of the IGBT 330 for the lower arm and the diode 166 for the lower arm through the wire 336 to a connection conductor 373D, (3) from the connection conductor 373D to the DC negative terminal 316 (not shown in the figure). It is to be noted that, similar to the upper arm, since the lower arm is constituted with two sets of the circuit units connected in parallel, where in each unit the IGBT 330 and the diode 166 are connected in parallel, in the current flow path of the above (1), the current is divided in two flows at the element-side connection conductor 371D, and the two divided currents flow respectively into the two sets of circuit units.

Here, the connection conductor 371U for connecting the IGBT 328 (and the diode 156) of the upper arm circuit with the DC positive terminal 314 (not shown in the figures) is placed near a substantial center of one side of the insulation substrate board 334. Then, the IGBT 328 (and the diode 156) is mounted in the vicinity of the other side, which is the opposite side of the above-described one side of the insulation substrate board 334 on which the connection conductor 371U is placed. And, in the present embodiment, two connection conductors 373U are placed in a row on the above-described one side of the insulation substrate board 334 sandwitching the above-described connection conductor 371U.

Figure 11:
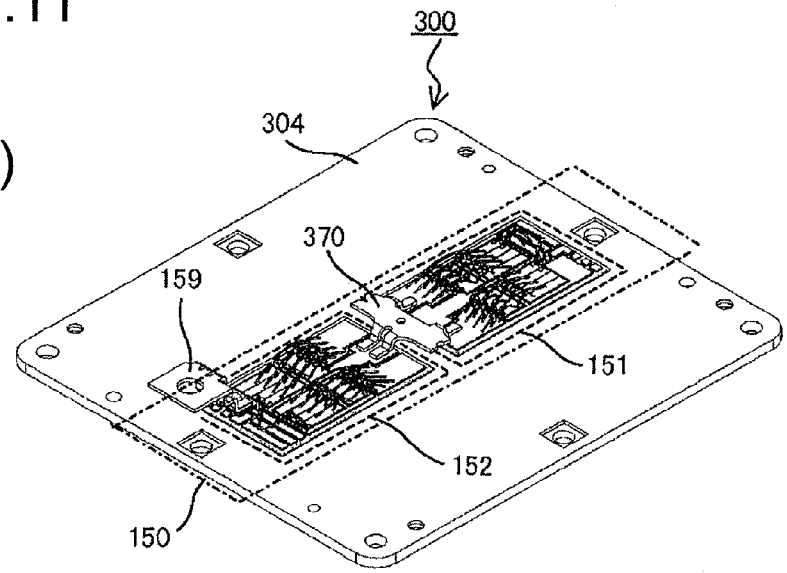
FIG. 11 is a view showing the flow of current in the power module 300.
Figure 11:
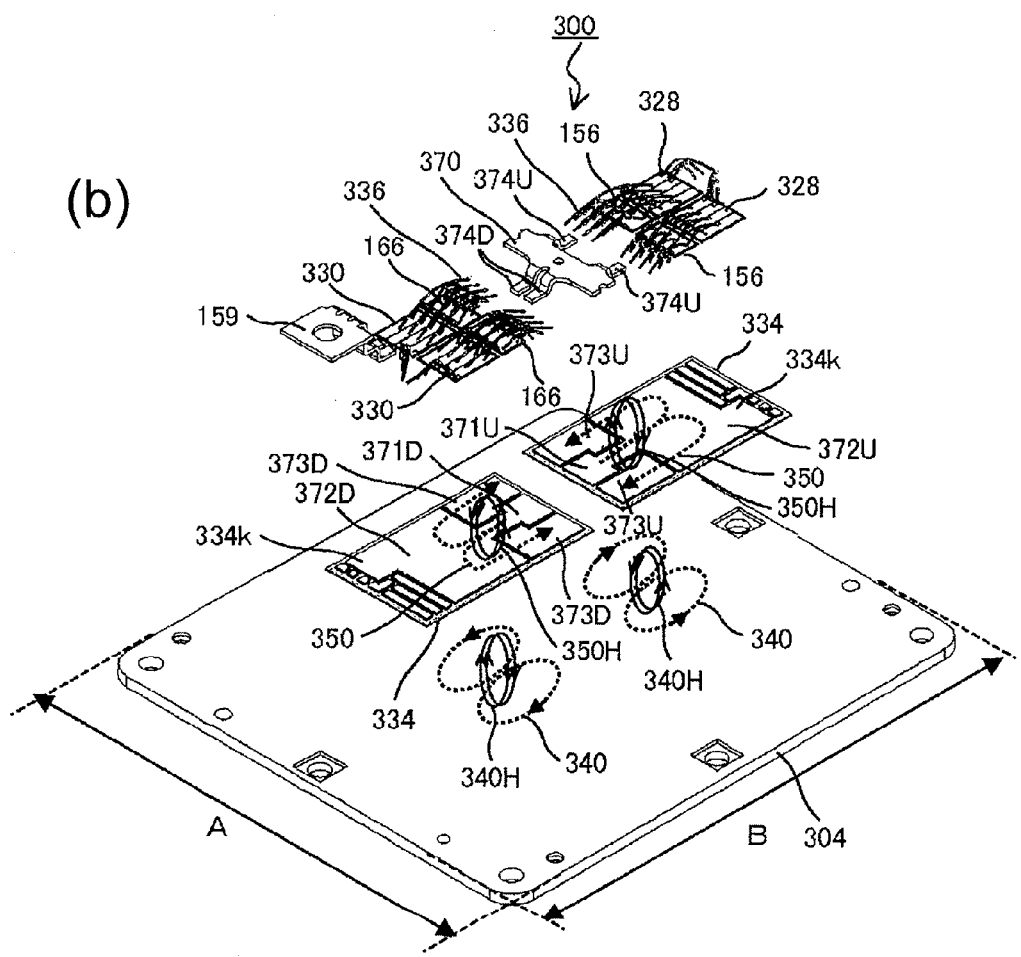

The patterns described above for wiring and device mounting, i.e., the circuit wiring patterns on the insulation substrate board 334 are configured to be a substantially T-shaped wiring pattern and two wiring patterns (371U) provided on both sides of the bar extending in longitudinal direction (371U) of the substantial T-shape, and by mounting terminals on the connection ends 371U and 373U the transient current path when switching the IGBT 328 becomes an M-shaped current path indicated by an arrow 350 (dashed line) of FIG. 11(*b*), i.e., two small-loop current paths (the arrow direction is of the lower arm being turned on). A magnetic field 350H is generated in an arrow 350H direction (solid line) of FIG. 11(*b*) around these two small-loop current paths. The magnetic field 350H causes induced current, i.e., a so-called eddy current 340 to be induced to the metal base 304, placed beneath the insulation substrate board 334. The eddy current 340 generates a magnetic field 340H, which cancels out the magnetic field 350H described above, thereby reducing parasitic inductance caused at the upper arm circuit.

In addition, the above-described two small loop currents are generated as two U-turn currents canceling out each other flowing on the insulation substrate board 334. Thus, a smaller loop magnetic field is generated in the power module 300 as indicated by the magnetic field 350H of FIG. 9(*b*), thereby reducing the parasitic inductance. In addition, since the magnetic field loop generated when switching is small enough to be confined inside the power module, the current induced on the housing that is surrounding the power module can be reduced, and malfunction of the control board and electromagnetic noise to outside of the power conversion device can also be prevented.

The lower arm circuit side assumes the patterns for circuit wiring and the component mounting similar to those of the upper arm described above. More specifically, the connection conductor 371D for connection of the IGBT 330 (and the diode 166) of the lower arm circuit and the DC negative terminal 316 (not shown in the figures) is placed near a substantial center of one side of the insulation substrate board 334. Then, the IGBT 330 (and the diode 166) are mounted in the vicinity of the other side, which is the opposite side of the above-described one side of the insulation substrate board 334 on which the connection conductor 371D is placed. In addition, in the present embodiment, two connection conductors 373D are placed in a row on the one side of the insulation substrate board 334 across the above-described connection conductor 371D.

Such patterns for circuit wiring pattern and component mounting contribute to reduce the above-described parasitic inductance also in the lower arm circuit side. It is to be noted that in the present embodiment, the entrance of the current path off or each of the arms of each of the phases is, for example, the connection conductor 371U, which is sandwiched by the two connection conductors 373U, whilst the exit of the current path is the two connection conductors 373U. However, even if the entrance and the exit are inverted, the small-loop current path is formed at each of the arms of each of the phases. As a result, similar to the upper arm circuit, parasitic inductance can be reduced and electromagnetic noise can be prevented at each of the arms of each of the phases.

Figure 12:
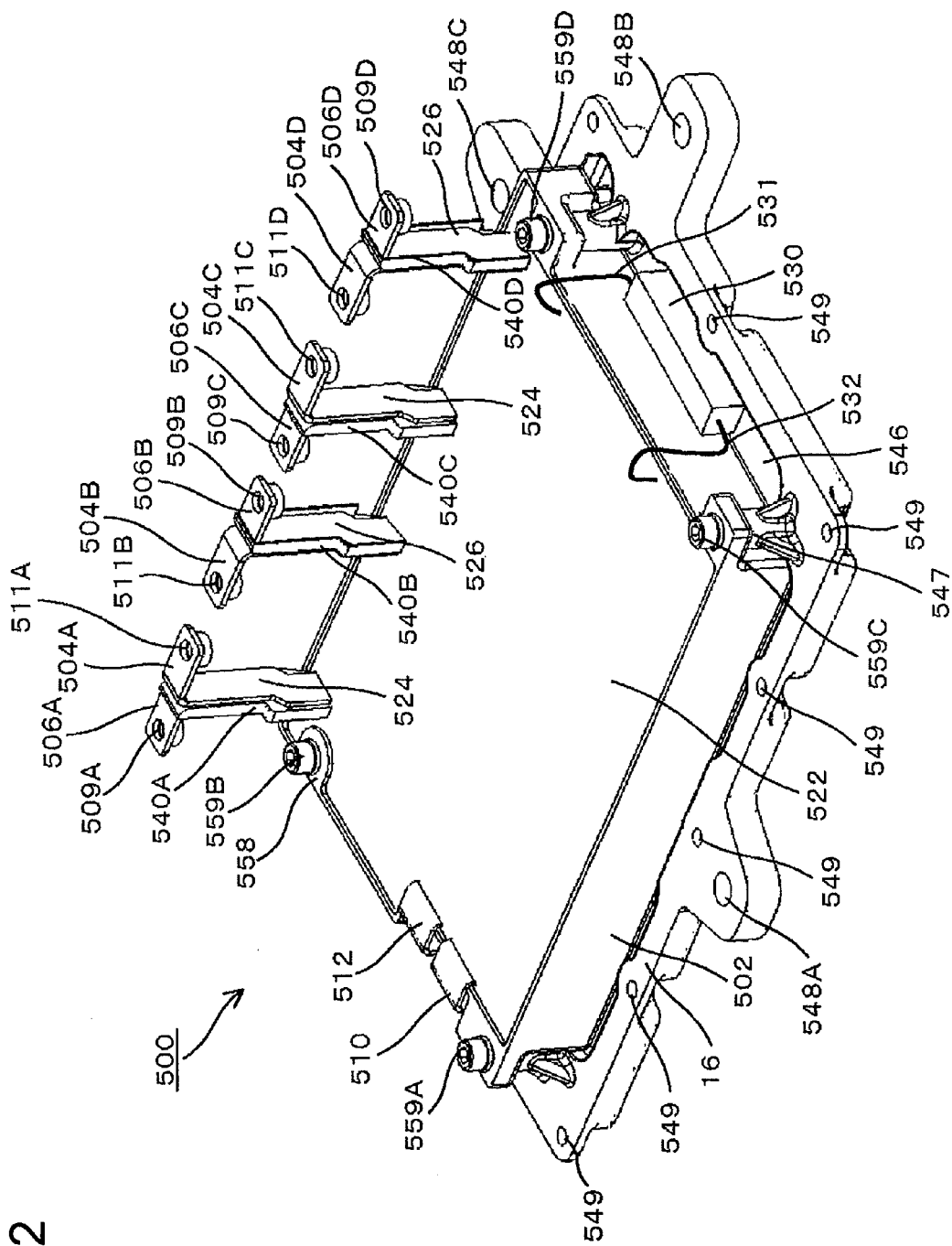
FIG. 12 is a perspective view showing the external structure of the capacitor module 500 according to the present embodiment.
Figure 13:
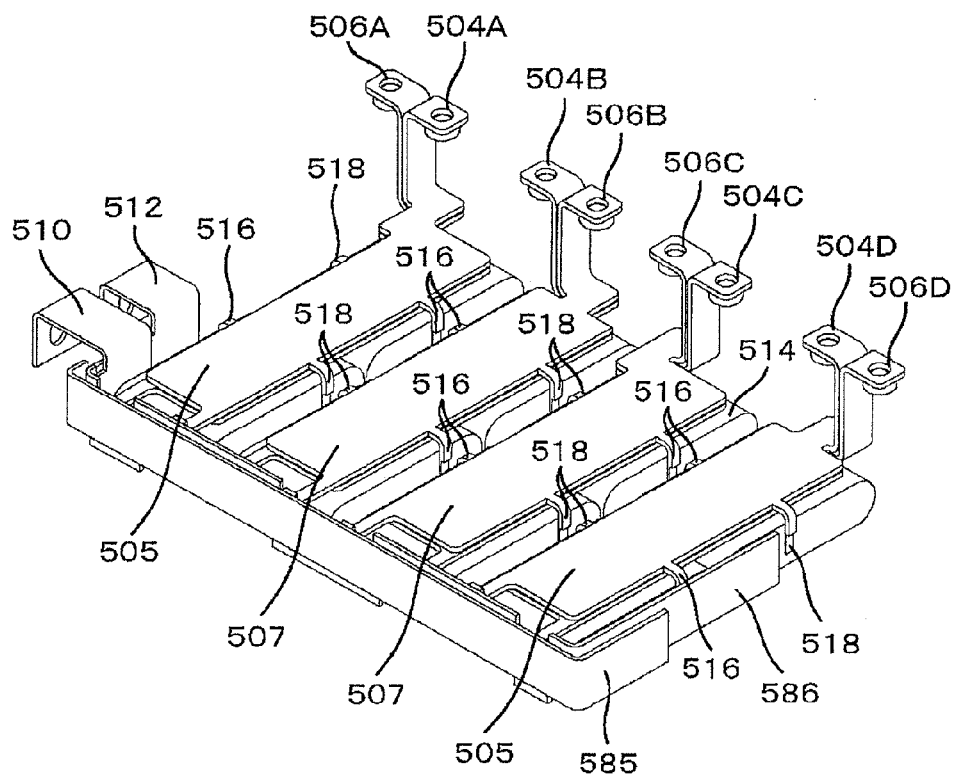
FIG. 13 is a perspective view showing the capacitor module 500 shown in FIG. 12 in a state where the filling material 522 such as a resin is yet to be filled, which clearly shows the inside of the capacitor module 500.
Figure 13:
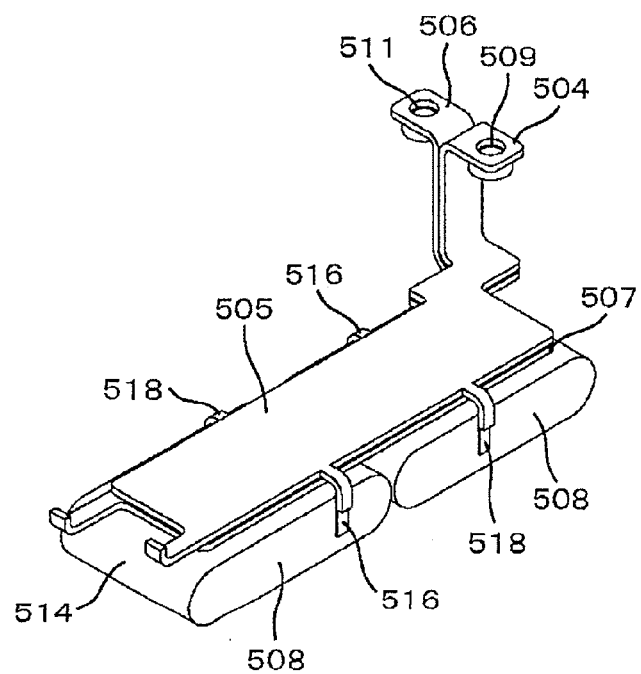

The structure of the capacitor module 500 of the present embodiment will now be explained in detail with reference to FIG. 12 and FIG. 13. FIG. 12 is a perspective view showing the external structure of the capacitor module 500 according to the present embodiment. FIG. 13 is a perspective view showing the capacitor module 500 shown in FIG. 12 in a state where the filling material (sealing material) 522 such as a resin is yet to be filled, for clearly showing the inside of the capacitor module 500.

In FIG. 12 and FIG. 13, the reference numeral 500 represents the capacitor module, the reference numeral 502 represents the capacitor case, the reference numeral 504 represents the negative capacitor terminal, the reference numeral 506 represents the positive capacitor terminal, the reference numeral 510 represents the DC negative electrode-side connection terminal portion, the reference numeral 512 represents the DC positive electrode-side connection terminal portion, and the reference numeral 514 represents the capacitor element.

As shown in FIG. 4, the capacitor module 500 according to the present embodiment is placed in the lower part of the housing 12 and mounted above the lower case 16. The capacitor case 502 is fixed to the lower case 16 with bolts 559A to 559D at four corners. The capacitor case 502 and the lower case 16 contact each other through a heat dissipation grease (not shown in the figure). This allows the heat generated by the capacitor element 514 to be transferred to the metal lower case 16 through the capacitor case 502 and the heat dissipation grease. In addition, adhesion properties of the heat dissipation grease suppress the vehicle vibration from being transmitted to the capacitor case 502.

Bolt holes 549 are holes for inserting bolts for fixing the lower case 16 to the housing 12. Bolt holes 548A to 548C are holes for inserting bolts for fixing the power conversion device 200 to the vehicle body side.

Four sets of superimposed bus bars, each of which is constructed by superimposing one positive terminal rising portion 526 and one negative terminal rising portion 524 each other, are formed along the side in the longitudinal direction of the capacitor module 500. The top ends of these rising portions are split and bent in opposite directions to each other and constitute the positive capacitor terminals 506A to 506D and the negative capacitor terminals 504A to 504D. In addition, the insulation covers 540A to 540D are individually disposed in the four sets of superimposed bus bars, thereby ensuring the creepage distances between the rising portions of the positive and negative terminals.

As shown in FIG. 13(*a*), a plurality of sets, of laminated conductor plates constituted with a negative conductor plate 505 and a positive conductor plate 507, e.g., four sets thereof in the present embodiment, are electrically connected in parallel to the DC (battery) negative electrode-side connection terminal portion 510 and the DC (battery) positive electrode-side connection terminal portion 512. The negative conductor plate 505 and the positive conductor plate 507 are provided with a plurality of the terminals 516 and the terminal 518 with which the positive electrodes and the negative electrodes of a plurality of the capacitor elements 514 are each connected in parallel.

The capacitor element 514 shown in FIG. 13(*b*), which is the unit structure of an electrical storage unit of the capacitor module 500 is constituted with a film capacitor 515, which is prepared by laminating and winding two layers of films onto one side of which metal such as aluminium is evaporated and making one of the two metals the positive electrode and the other the negative electrode. The axial end planes formed by winding the positive electrode and the negative electrode constitute electrodes 508 of the positive electrode and the negative electrode, respectively, onto which a conductive material such as tin is sprayed during production.

Further, the negative conductor plate 505 and the positive conductor plate 507, constituted with a wide thin plate conductor, have a superimposed structure via an insulation paper not shown in the figures so as to reduce parasitic inductance. On the edge portions of the superimposed conductors, the terminals 516 and 518 for connection with the electrode 508 of the capacitor element 514 are provided. The terminals 516 and 518 are electrically connected with the two electrodes 508 of the capacitor element 514 by soldering or welding. For facilitating the electrical connection by a soldering—or a welding machine easy, and for facilitating the following inspection, two capacitor cells are arranged to form one capacitor group unit, where an arrangement of the capacitor cells and the conductors is adopted to enable their connecting surfaces to face outside, as shown in the figure. Such cell group enables increasing or decreasing the number of capacitor cells according to the capacitor capacitance, therefore suited for mass production. A plurality of the terminals 516 and 518 may be provided for reducing parasitic inductance and for transferring the heat.

In addition, the negative conductor plate 505 and the positive conductor plate 507 are bent at the ends of the wide thin-plate conductors thereof so as to form the negative capacitor terminal 504 and the positive capacitor terminal 506 for connection with the DC-side conductor plate 700 (refer to FIG. 12). In addition, the negative conductor plate 505 and the positive conductor plate 507 are bent at the ends of the wide thin-plate conductors thereof so as to be connected to wiring bus bars 585 and 586 in the capacitor module, respectively. The DC negative electrode-side connection terminal portion 510 and the DC positive electrode-side connection terminal portion 512, which are connected to terminal for battery power receiving, are formed at the ends of the wiring bus bars 585 and 586.

As shown in FIG. 13, the capacitor module 500 is constituted with the eight capacitor cells 514 in total, i.e., longitudinally arranged four rows of groups of two elements. Terminals provided to the capacitor module 500 for external connection are four pairs of the positive and negative capacitor terminals 504 and 506 that are connected with the DC-side conductor plate 700 and the DC negative electrode-side connection terminal portions 510 and 512 for receiving the battery power. Openings 509 and 511 into which nuts are mounted are formed at the positive and negative capacitor terminals 504 and 506 so that they are fixed to the DC positive and negative terminals 316 and 314 of the power module 300 by screws.

Due to ripple current when switching, in the capacitor module 500 heat is generated by resistances of a metal thin film evaporated onto the film inside the capacitor element and of an inner conductor (terminal). For making the capacitor elements moisture-resistant, the capacitor cells and the inner conductors (terminal) are molded to the capacitor case 502 with resin (refer to FIG. 12). Thus, the capacitor elements and the inner conductors are adhered to the capacitor case 502 through the resin, thereby constituting a structure in which the heat generated by the capacitor cell is easily transferred to the case. Further, since in the present structure, the negative conductor plate 505 and the positive conductor plate 507 are directly connected with the electrodes 508 and the terminals 516 and 518 of the capacitor element, the heat generated in the capacitor cell is directly transferred to the negative-electrode and positive-electrode conductors, and the heat is easily transferred to the mold resin due to the wide conductor. As a result, the heat is transferred well from the capacitor case 502 to the lower case 16, from the lower case 16 to the housing 12, and further to the cooling water flow path 19, thereby ensuring the heat dissipation.

While in the present embodiment, as shown in FIG. 13, a structure in which the negative conductor plates 505 and the positive conductor plates 507 are longitudinally arranged separately in four rows is adopted, an integrated structure in which all the capacitor cells 514 are connected to a wide conductor plate integrally constituted with these four rows of the negative-electrode conductors 505 and the positive-electrode conductors 507 may be adopted. As a result, the number of components can be reduced, the productivity can be improved, the electrostatic capacitance of the capacitor cells 514 can be used substantially equally, and the component life of the entire capacitor module 500 can be extended. In addition, the use of the wide conductor plate can lead to reduction in the parasitic inductance.

Figure 14:
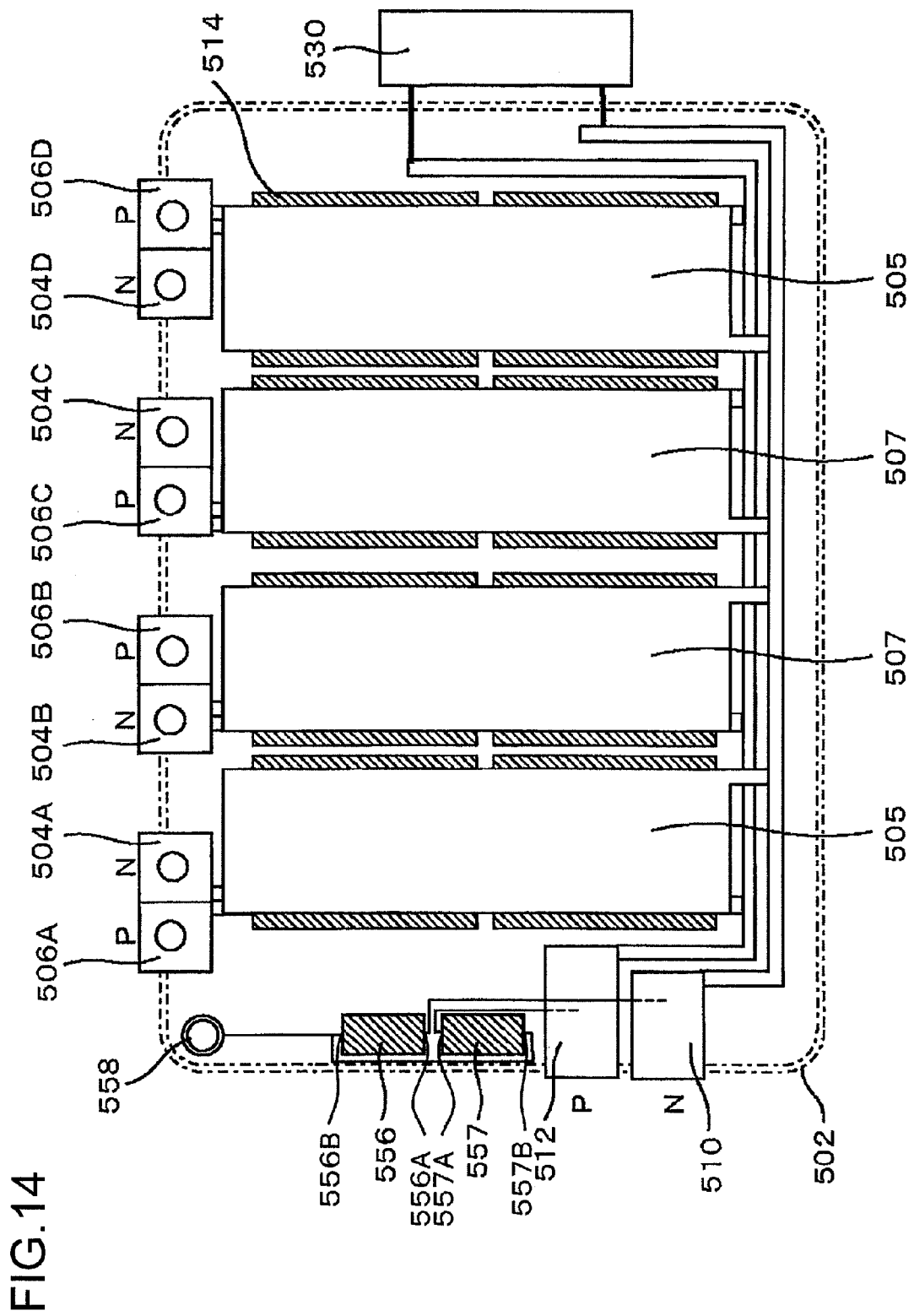
FIG. 14 is a schematic view showing a connection status of the capacitors 556 and 557 for noise filter with the discharge resistor 530.

FIG. 14 is a schematic view showing a connection status of the capacitors 556 and 557 for noise filter with the discharge resistor 530.

Important components of the principal circuit of the power conversion device 200 are the power module 300, the capacitor module 500 for smoothing, the capacitors 556 and 557 (noise removal capacitor module), and the discharge resistor 530. These components fall into a category of large-sized components among the components of the power conversion device 200, and thus they often become obstacles to size reduction of the power conversion device. Or, even if the power conversion device has successfully been reduced in size, paradoxical problems such as a reduction in cooling performance and an increase in wiring inductance and contaminated noise may arise. A structure in which the entire power conversion device is reduced in size while preventing the reduction in cooling performance and the increase in wiring inductance or contaminated noise will be explained below.

Figure 15:
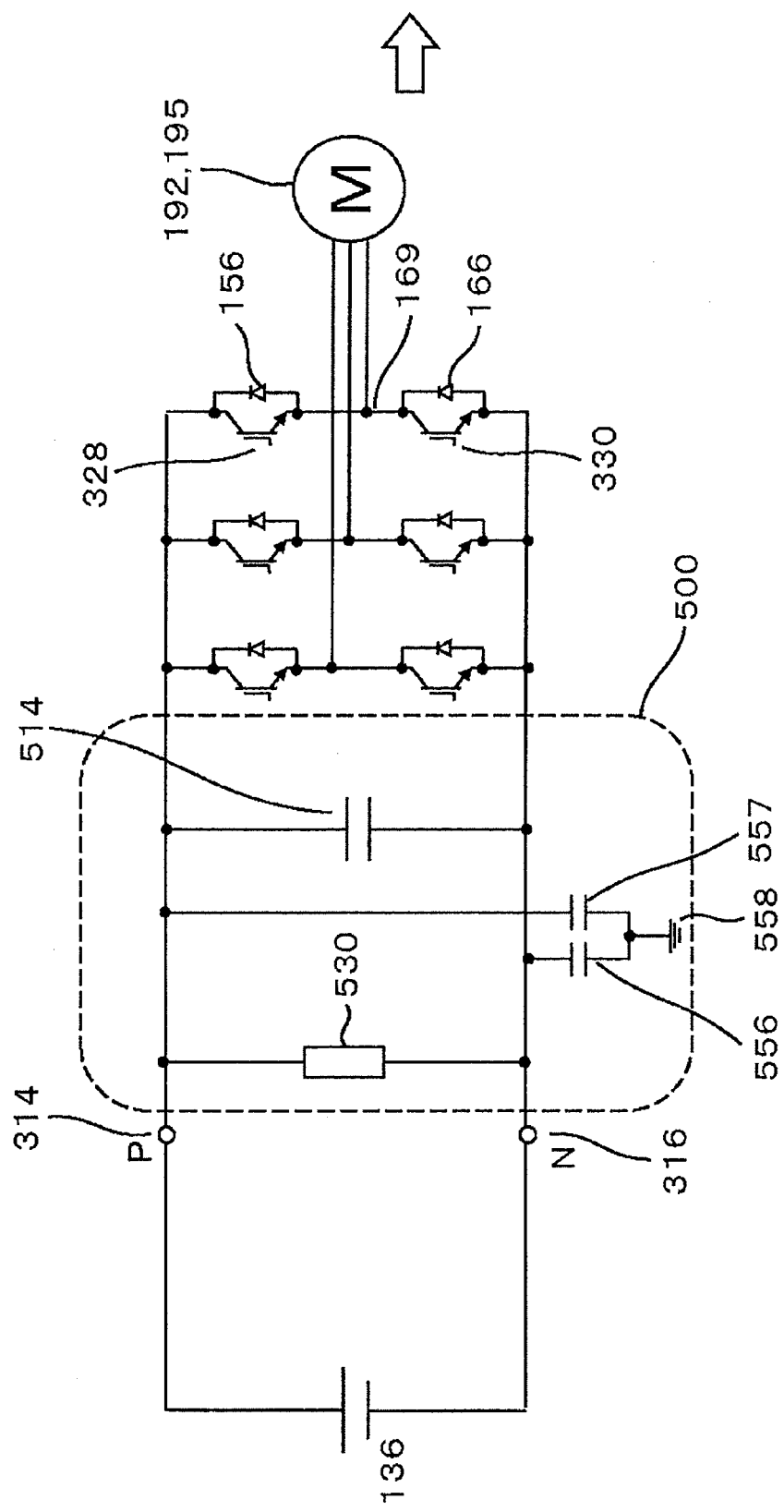
FIG. 15 is a circuit diagram at the periphery of the capacitor module 500.
Figure 16:
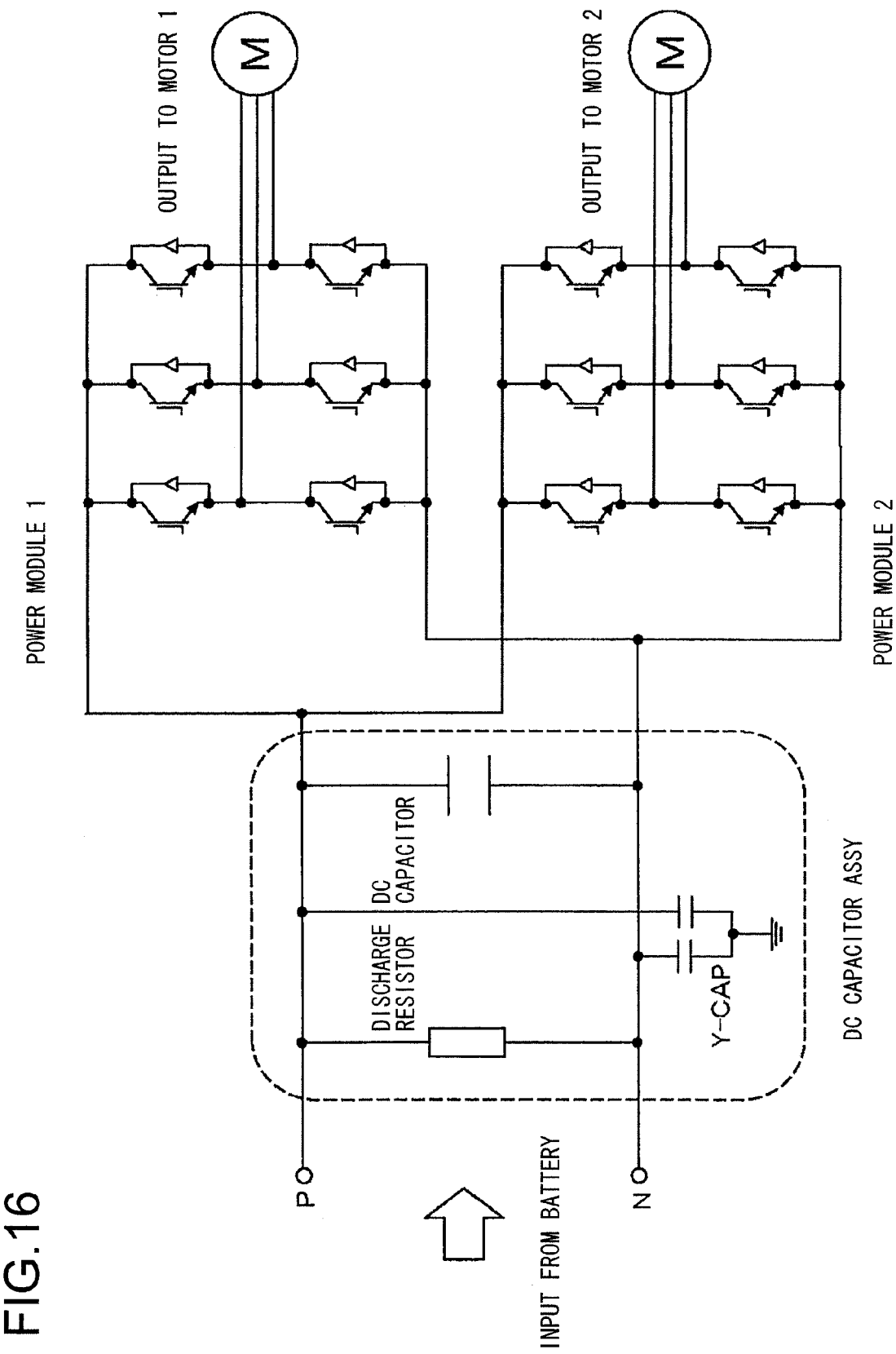
FIG. 16 is a diagram explaining a configuration in which two power modules are connected to a common capacitor module as in the present embodiment.

FIG. 14 and FIG. 15 show the electrical connection of the capacitor module 500 with the power module 300 and the battery 136. In addition, FIG. 16 is a diagram explaining a configuration in which two power modules are connected with a common capacitor module as in the present embodiment. As described earlier, the capacitor module 500 includes the discharge resistor 530 and the capacitors 556 and 557 in addition to the capacitor element 514 for smoothing. The capacitor element 514 operates to smooth out the ripple voltage and ripple current for the DC circuit sections, and to supply stable electric power to the power module 300. By contrast, the capacitors 557 and 556 have a noise removal function.

Reduction of the size is achieved by placing each component at a position where those functions are optimized and by integrating or modularizing them. The capacitor element 514, the discharge resistor 530, and the capacitors 556 and 557 correspond to the area indicated with the dashed line of FIG. 15.

The capacitors 557 and 556 are placed adjacent to the DC-side positive-electrode and negative-electrode side input terminal portions 512 and 510 (the first DC power supply terminals) that are connected with the battery 136. And, the capacitors 557 and 556 include terminals 556A and 557A (the second DC power supply terminal, FIG. 14), at which the capacitors 557 and 556 are connected to the DC-side input terminal portions 512 and 510 (the first DC power supply terminals). Then, the capacitors 557 and 556 are arranged so that the distance between the terminals 556A and 557A (the second DC power supply terminals) and the DC-side input terminal portions 512 and 510 (the first DC power supply terminals) is less than the distance between the terminals 556A and 557A (the second DC power supply terminals) and the positive and negative capacitor terminals 504 and 506.

In the example of FIG. 14, since the connection from the terminals 556A and 557A (the second DC power supply terminals) to the positive and negative capacitor terminals 504 and 506 is made through the connection from the terminals 556A and 557A (the second DC power supply terminals) to the DC-side input terminal portions 512 and 510 (the first DC power supply terminals), the distance between the terminals 556A and 557A (the second DC power supply terminals) and the DC-side input terminal portions 512 and 510 (the first DC power supply terminals) is obviously less than the distance between the terminals 556A and 557A (the second DC power supply terminals) and the positive and negative capacitor terminals 504 and 506.

On the other hand, terminals 556B and 557B (FIG. 14) of one side of those capacitors 556 and 557 are grounded to a ground terminal 558. As shown in FIG. 12, at the ground terminal 558 they are fixed coaxially together when the capacitor module 500 is fixed to the housing 12 with the bolt 559B. In other words, the fixing of the capacitors 556 and 557 to the ground and the fixing of the capacitor module 500 to the housing 12 are performed at a common position.

Figure 17:
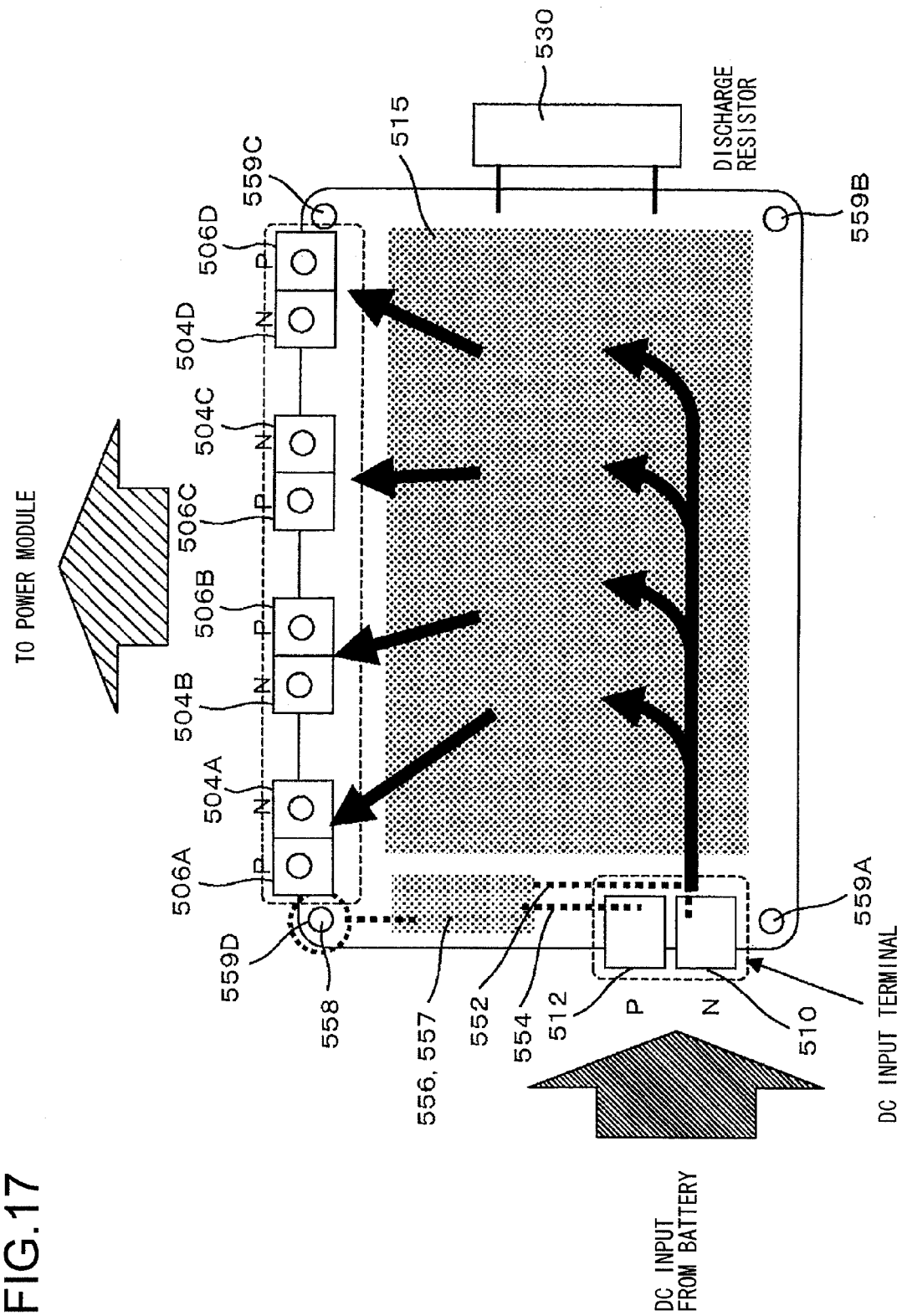
FIG. 17 is an overview of the capacitor module 500 on which the electrical flow is illustrated.

The operations and advantageous effects according to the above structure will be explained with reference to FIG. 17. FIG. 17 is an overview of the capacitor module 500 on which the electrical flow is illustrated. The current from the battery 136 flows through the DC-side input terminal portions 512 and 510 to the capacitor module 500, passes through the smoothing capacitor element group 515, and is supplied through the positive and negative capacitor terminals 506 and 504 to the power module 300. In short, smoothed power is supplied to the power module.

On the other hand, the capacitors 557 and 556 and the terminals (the second DC power supply terminals) of the capacitors 557 and 556 are disposed in the close vicinity of the DC-side input terminal portions 512 and 510 so that the noise from the power source can be removed efficiently. In particular, the above structure can prevent the capacitors 557 and 556, being affected by the switching of the power module 300, from functioning as a part of a ripple smoothing capacitor and from failing to perform the noise removal function. In addition, the heat generation of the capacitors 557 and 556 themselves by functioning as a part of a ripple smoothing capacitor can be prevented. It is to be noted that the plate-like conductor is used to provide wirings 552 and 554 extending from the capacitors 557 and 556 with a superimposed structure with an insulation layer between them, thereby achieving low inductance in wiring.

Figure 18:
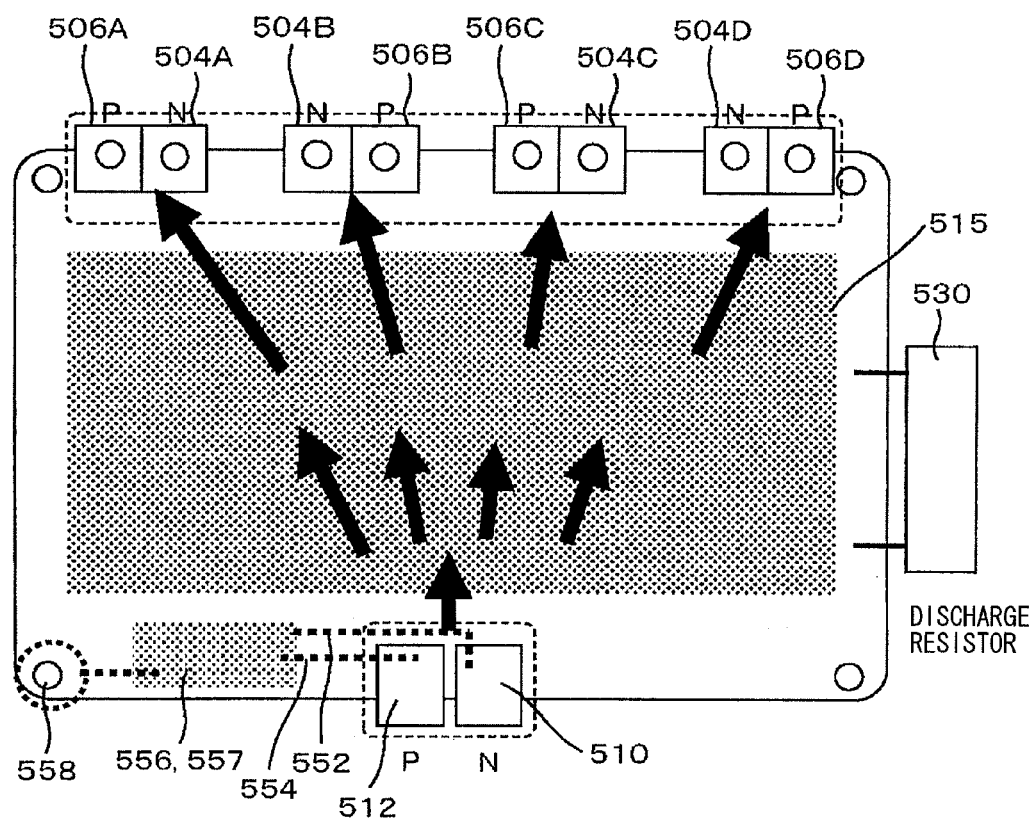
FIG. 18 is an overview of the capacitor module 500 according to another embodiment on which the electrical flow is illustrated.

FIG. 18 a view showing another embodiment related to the position relationship of the capacitors 557 and 556, the DC-side input terminal portions 512 and 510, and the positive and negative capacitor terminals 504 and 506.

The difference between the embodiment of FIG. 18 and the embodiment of FIG. 17 lies in that the DC-side input terminal portions 512 and 510 are placed opposite to the positive and negative capacitor terminals 504 and 506 across the capacitor element group 515. In addition, the capacitors 557 and 556 and the terminals (the second DC power supply terminals) of the capacitors 557 and 556 are disposed in the close vicinity of the DC-side input terminal portions 512 and 510, similar to the embodiment of FIG. 17. More specifically, the capacitors 557 and 556 include the terminals (the second DC power supply terminals) for connection with the DC-side input terminal portions 512 and 510 (the first DC power supply terminals), and are placed so that the distance between the terminals (the second DC power supply terminals) and the DC-side input terminal portions 512 and 510 (the first DC power supply terminals) is less than the distance between the terminals (the second DC power supply terminals) and the positive and negative capacitor terminals 504 and 506.

Such structure allows the capacitors 557 and 556 to be further less affected by the switching of the power module 300, so that most of the capacitance of the capacitors 557 and 556 can be utilized for noise removal, thereby reducing the impact of noise entering the power conversion device.

The arrangement of the discharge resistor 530 according to the present embodiment will now be explained.

As shown in FIG. 12 and FIG. 14, the discharge resistor 530 is provided on the lateral portion of the outside wall of the capacitor case 502. While in the present embodiment, the discharge resistor 530 is provided on the lateral portion of the capacitor module 500, it may be provided on any place, as long as the placing position does not give thermal influence to internals of the capacitor module. For instance, the discharge resistor 530 may be positioned above an exposed surface of the filling material 522 spaced by some millimeters. Such arrangement allows the power conversion device to be reduced in width without reducing the region on which the capacitor element 514 is mounted.

The position relationship between the discharge resistor 530 and the capacitor module 500 according to the present embodiment is shown in FIG. 12. The discharge resistor 530 is fixed to the lower case 16. A bracket or the like may be used for fixing, or an adhesive material or the like may be applied between the discharge resistor 530 and the lower case 16. In other words, any fixing method may be adopted as long as a transfer path for heat generated by the discharge resistor 530 is formed between the discharge resistor 530 and the lower case 16.

In addition, when the discharge resistor 530 is provided on the lateral portion of the capacitor module 500, a part of the capacitor case 502 and a part of the filling material 522 lie in a space between the discharge resistor 530 and the capacitor element 514. As a result, the heat generated by the discharge resistor 530 becomes less transferable to the capacitor element 514, thereby achieving thermal insulation between the discharge resistor 530 and the capacitor element 514 while the heat of the discharge resistor 530 is transferred downward.

The discharge resistor 500 includes positive electrode and negative electrode leads 531 and 532, which are electrically connected to the capacitor element 514.

In the present embodiment, as shown in FIG. 14, the discharge resistor 530 is provided on the capacitor case 502 on the opposite side to the side on which the DC-side input terminal portions 512 and 510 are formed. Because of such arrangement, the discharge resistor 530, which is a heat generating source, is separated from the capacitor element 514 and the DC-side input terminal portions 512 and 510. As a result, a concentrative heat generation on one side is prevented over the entire power conversion device 200, thereby averaging the thermal balance.

Figure 19:
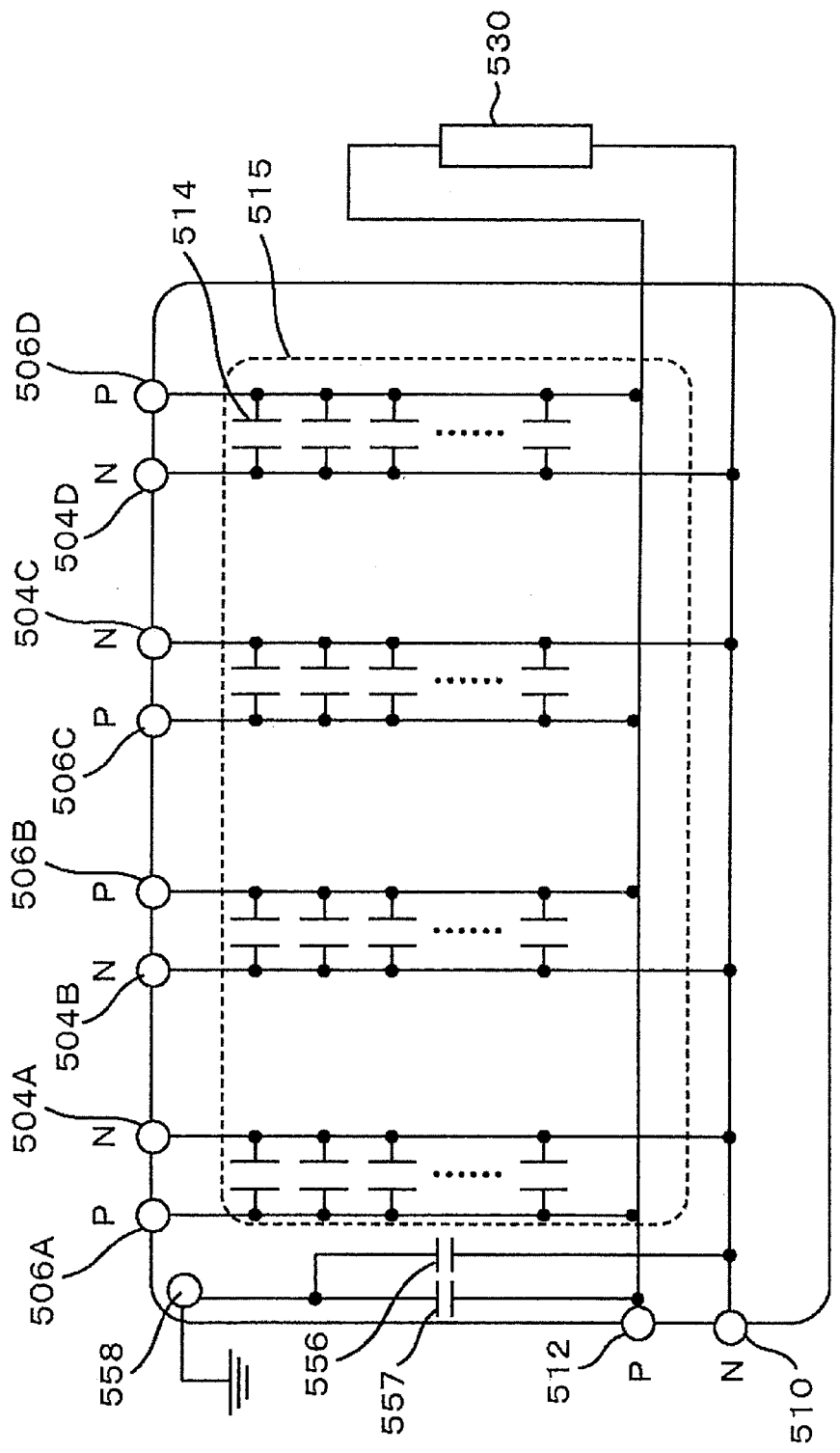
FIG. 19 is a view showing the physical relationship of the electrical connection in the capacitor module 500.

FIG. 19 is a view showing the physical relationship of the electrical connection inside the capacitor module 500. This figure indicates that since the distance between the terminals (the second DC power supply terminals) of the capacitors 557 and 556 and the DC-side input terminal portions 512 and 510 (the first DC power supply terminals) is less than the distance between the above terminals (the second DC power supply terminals) and the positive and negative capacitor terminals 504 and 506, the capacitors 557 and 556 are less affected by the switching of the power module 300.

In addition, the capacitors 557 and 556, which remove noise from the DC-side input terminal portions 512 and 510, which receive the power from the battery 136, and the discharge resistor 530 for discharging the charge on the capacitor element 514 constitute one module. Such components having functionally close connections are put into one module so that the wiring length of each component can be reduced, thereby achieving low inductance and size reduction.

Figure 20:
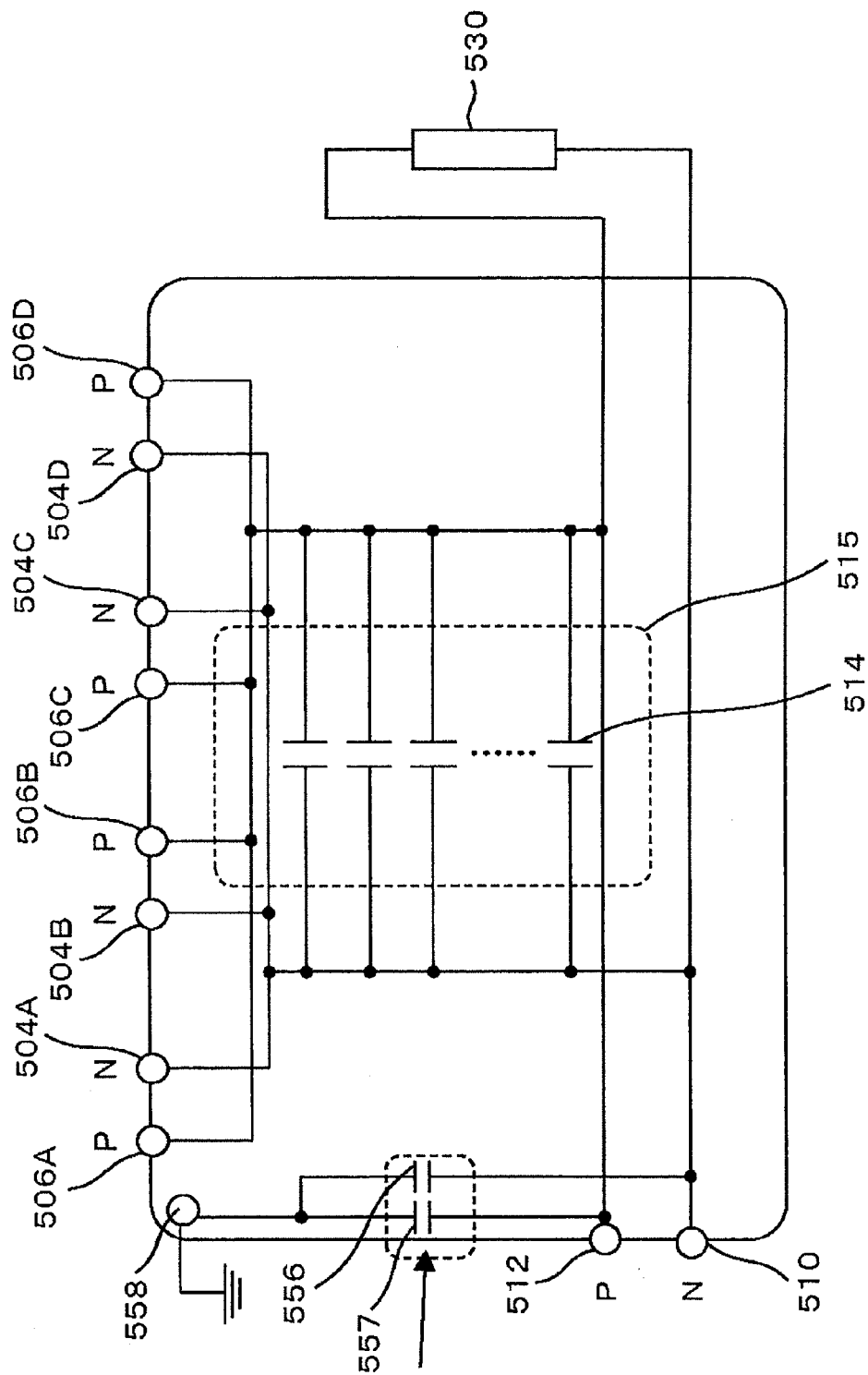
FIG. 20 is a view showing the physical relationship of the electrical connection in the capacitor module 500 according to another embodiment.

It is to be noted that FIG. 20 is a view showing the electrical connection relationship in a structure in which the negative-electrode conductor 505 and the positive-electrode conductor 507 are each made of wide conductor plates and are integrated, and all the capacitor cells 514 are connected thereto. Even in such structure, the respective components are, as shown in FIG. 19, put into a module, thereby achieving the operations and advantageous effects similar to those in FIG. 19.

Figure 21:
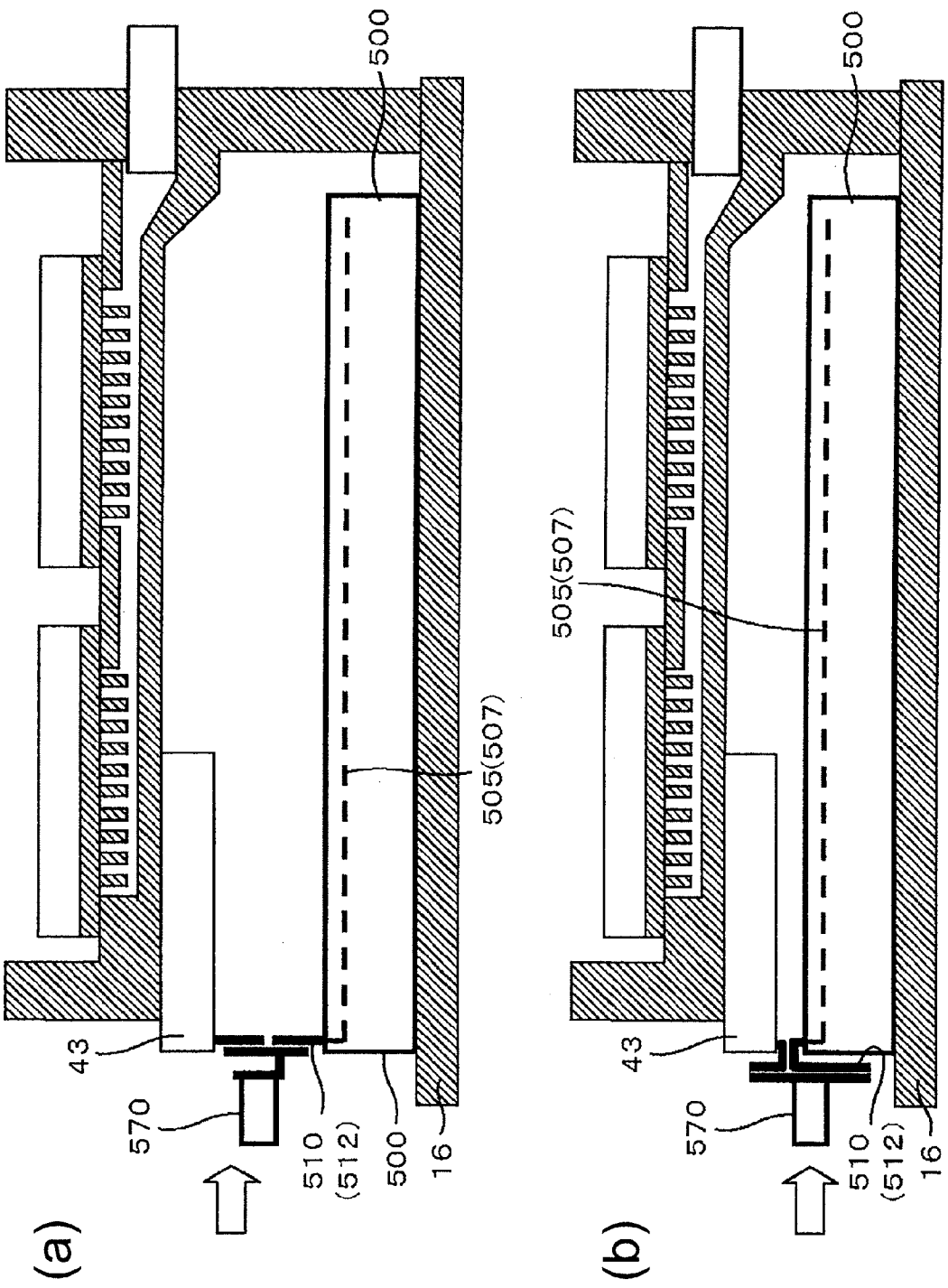
FIG. 21 is a schematic view of the A cross section of FIG. 3.

FIG. 21 is a schematic view of the A cross section of FIG. 3. The inverter device 43 for auxiliaries is fixed directly below the cooling water flow path 19. The capacitor module 500 provides also a smoothing function to the inverter device 43 for auxiliaries electrically connected in parallel to the capacitor module 500, in addition to the power module 300 for driving the motor.

In the present embodiment, the DC-side input terminal portions 512 and 510 are provided in the capacitor module 500, and in addition, the inverter device 43 for auxiliaries is provided in the vicinity of the capacitor module 500. In the present embodiment, a conductive member 570 shown in FIG. 22 is used as a member to assume those electrical connections.

Figure 22:
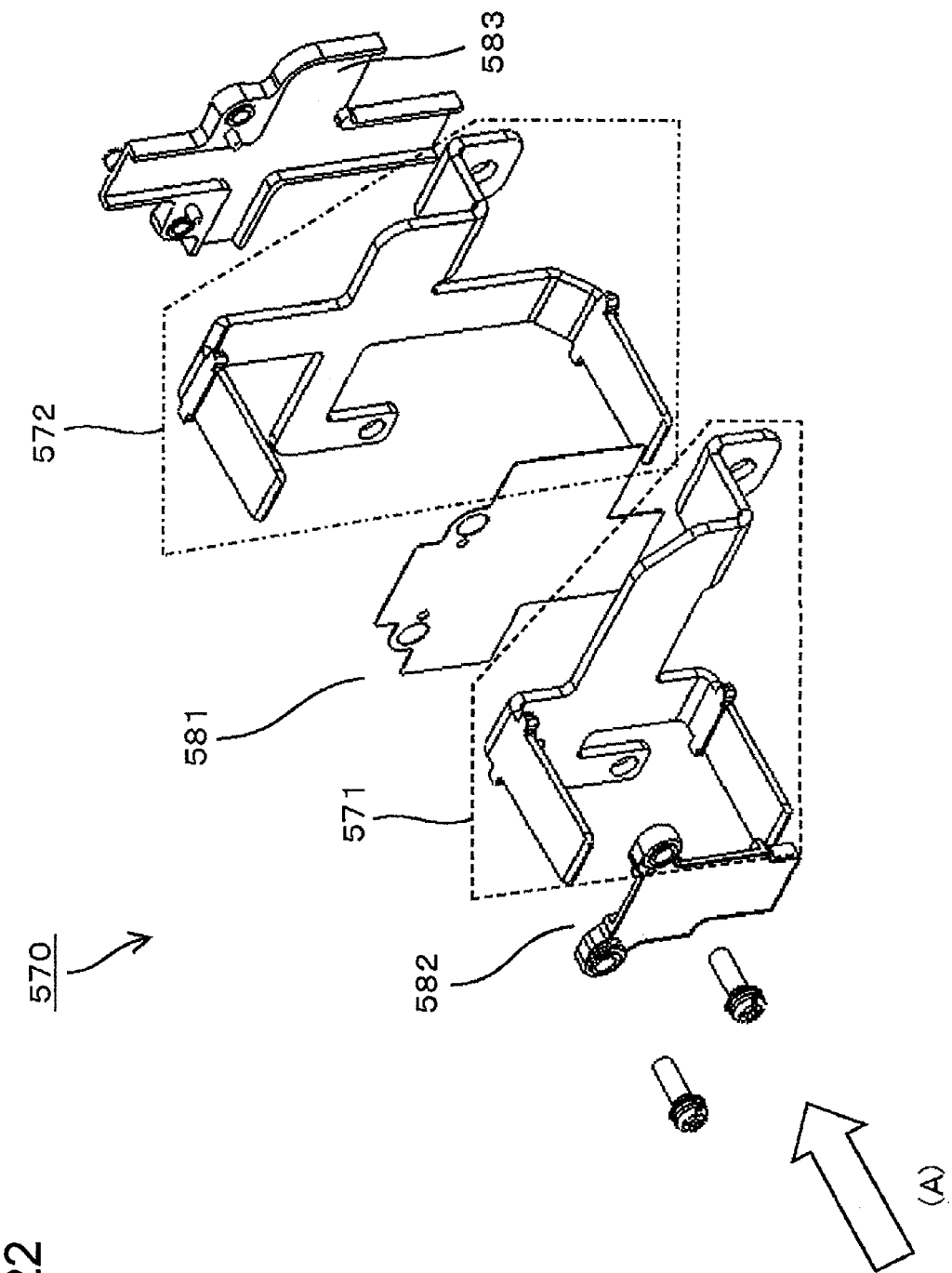
FIG. 22 is an external perspective view of the conductive member 570.

The conductive member 570 is, as shown in FIG. 22, constituted with a negative electrode-side conductive member 571, a positive electrode-side conductive member 572, an insulation paper 581, a negative electrode-side resin bracket 582, and a positive electrode-side resin bracket 583. Seen from the direction of (A) in FIG. 22, the negative electrode-side conductive member 571 and the positive electrode-side conductive member 572 show the shape of a cross (+). In addition, longitudinally formed members of the negative electrode-side conductive member 571 and the positive electrode-side conductive member 572 are bent in L-shape in the same direction.

Since the negative electrode-side conductive member 571 and the positive electrode-side conductive member 572 are configured in a superimposed state across the insulation paper 581, reduction in wiring inductance is achieved. In addition, since the positive electrode-side resin bracket 583 is formed to cover the portion except the terminal portion formed at the top end of the conducting members, the positive electrode-side conductive member 572 and the metal housing 12 can be prevented from electrically contacting.

Figure 23:
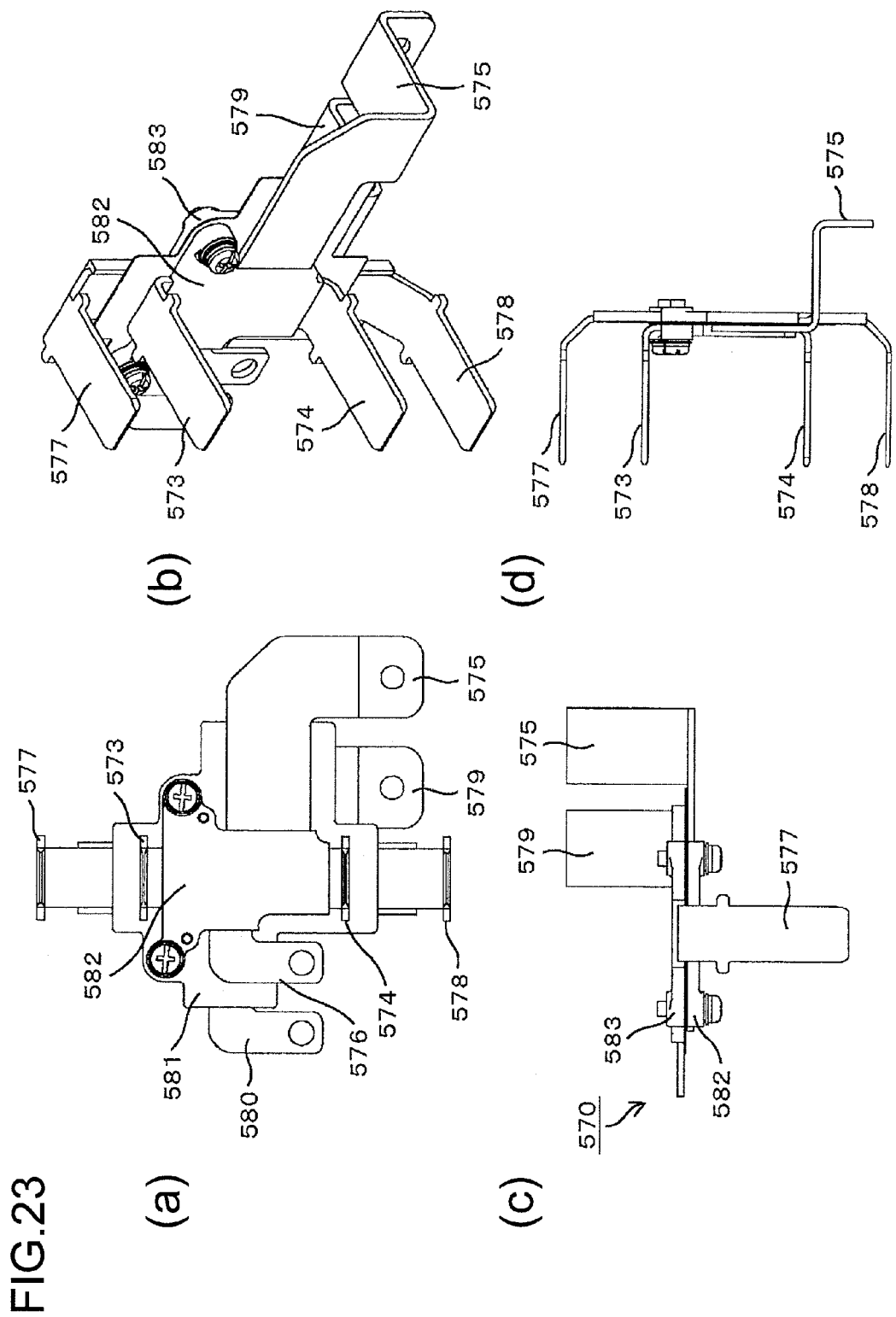
FIG. 23 is an external view of the conductive member 570.

As shown in FIG. 23(*b*), the bent member of the negative electrode-side conductive member 571 makes a negative electrode-side DC input terminal 573 and a negative electrode-side DC output terminal 574. On the other hand, the bent member shaped into L of the positive electrode-side conductive member 572 makes a positive electrode-side DC input terminal 577 and a positive electrode-side DC output terminal 578.

Electric power is supplied from the battery 136 to the positive electrode-side DC input terminal 577 and the negative electrode-side DC input terminal 573. This electric power is partially supplied to the inside of the power conversion device 200. On the other hand, the rest of the electric power is output from the positive electrode-side DC output terminal 578 and the negative electrode-side DC output terminal 574 without being supplied to the inside of the power conversion device 200. The output electric power is supplied to another inverter such as an inverter for air-conditioner in the vehicle interior through an electrical wire not shown in figures. In other words, the conductive member 570 serves as a function of transfer point of power supply from the battery 136 to the inverter for air-conditioner, in addition to the function as a terminal of power supply to the power conversion device 200. Such structure allows the electrical wiring from the battery 136 to the inverter for air-conditioner (the distance from the power conversion device 200 to the inverter for air-conditioner) to be reduced, thereby facilitating the wiring work for the electrical wires in the vehicle interior.

Among the laterally formed members of the negative electrode-side conductive member 571 and the positive electrode-side conductive member 572, the left-side members have downward extending ends thereof so as to form terminals for connection with the inverter device 43 for auxiliaries.

Among the laterally formed members of the negative electrode-side conductive member 571 and the positive electrode-side conductive member 572, the right-side members have downward extending ends thereof, and the downward extending members are bent in the opposite direction to the bending direction of the negative electrode-side DC input and output terminals 573 and 574 and the positive electrode-side DC input and output terminals 577 and 578. In addition, the top ends of the bent members are bent vertically downward, and their ends are connected with the DC-side input terminal portions 512 and 510.

The power conversion device shown in FIG. 21(*a*) has the DC-side input terminal portions 512 and 510 of the capacitor module 500 which protrude vertically upward and the terminal of the inverter device 43 for auxiliaries which protrudes vertically downward. When the conductive member 570 according to the present embodiment is connected to such terminal, the height of the power conversion device is increased by the height of the terminal.

Then, in the power conversion device according to the present embodiment, as shown in FIG. 21(*b*), the DC-side input terminal portions 512 and 510 of the capacitor module 500 are bent at two parts so as to form the top end portions of the DC-side input terminal portions 512 and 510 and to be positioned at the lateral portion of the capacitor module case 502. In addition, the terminal of the inverter device 43 for auxiliaries is also bent at two parts so as to form the top end portion of the terminal positioned at the lateral portion of the inverter device 43 for auxiliaries.

Those terminals of the DC-side input terminal portions 512 and 510 and the inverter device 43 for auxiliaries are connected with the conductive member 570 so that the connection terminals with the battery 136 can be provided on the lateral portions of the inverter device 43 for auxiliaries and the capacitor module 500. This allows to avoid an increase of the power conversion device in the height direction.

It is to be noted that the DC-side input terminal portions 512 and 510 may be formed to directly protrude from a side wall of the capacitor module case 502, and similarly, the terminal of the inverter device 43 for auxiliaries may be formed directly on a side wall of the inverter device 43 for auxiliaries.

Figure 24:
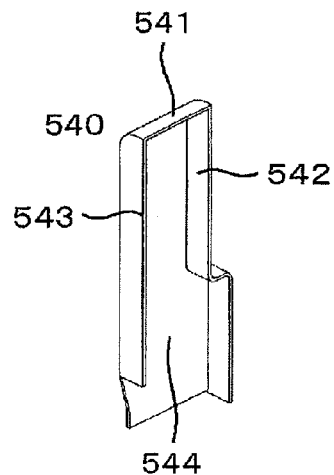
FIG. 24 is an external perspective view of the insulation cover 540 according to the present embodiment.
Figure 24:
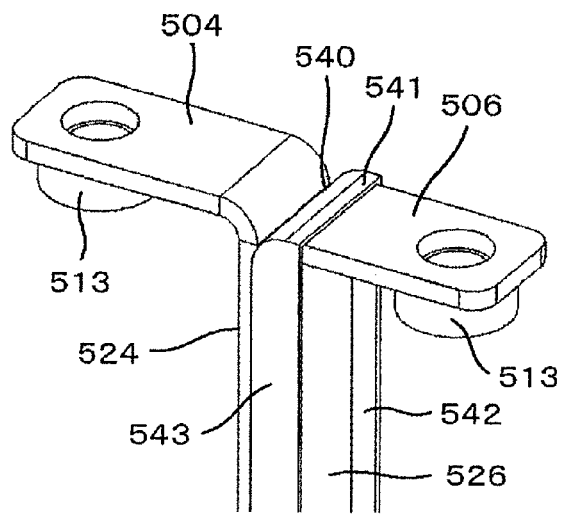
Figure 24:
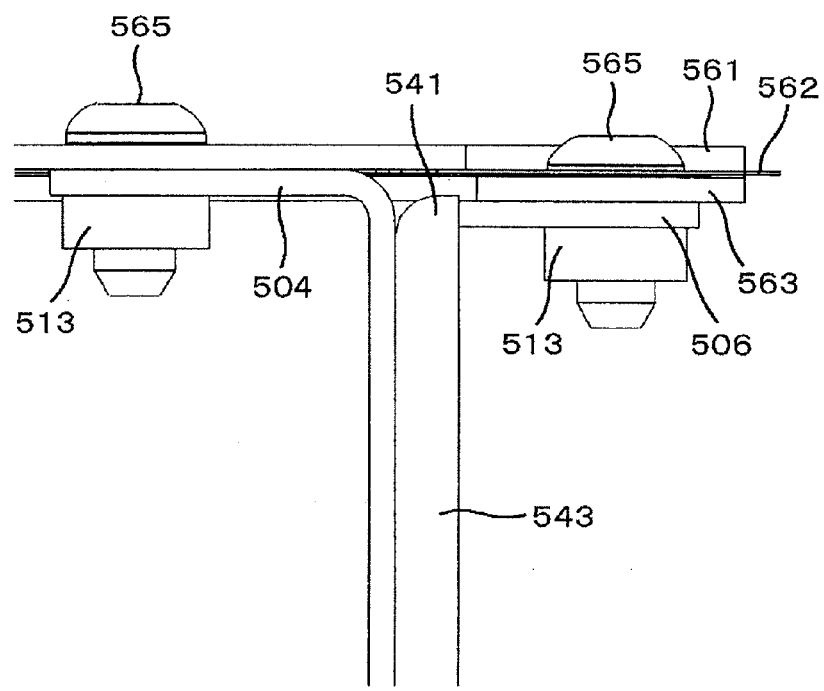

FIG. 24 is an external perspective view of the insulation cover 540 according to the first embodiment. The insulation cover 540 is substantially rectangular. An upper rising portion 541 and lateral rising portions 542 and 543 are provided on the outer edge of an insulation cover main surface 544 in the perpendicular direction of the insulation cover main surface 544. There is no rising portion provided on the outer edge downward of the insulation cover main surface 544. The insulation cover 540 is inserted between the negative terminal rising portion 524 and the positive terminal rising portion 526 through the point at which no rising portion exists.

The inserted insulation cover 540 is hung upon the positive capacitor terminal 506 by the upper rising portion 541 and fixed between the negative terminal rising portion 524 and the positive terminal rising portion 526. It is to be noted that the upper rising portion 541 faces to the side of the positive capacitor terminal 506. This allows the exposed portion of the positive capacitor terminal 506 to be covered, thereby ensuring insulation of the terminal.

In the capacitor module 500 according to the present embodiment, the negative terminal rising portion 524 and the positive terminal rising portion 526 are formed in a superimposed state so as to reduce the wiring inductance from the capacitor module 500 to the power module 300. However, it is necessary to ensure insulation between the negative terminal rising portion 524 and the positive terminal rising portion 526. Then, the upper rising portion 541 and the lateral rising portions 542 and 543 of the insulation cover 540 according to the first embodiment ensure the creepage distance between the negative terminal rising portion 524 and the positive terminal rising portion 526, thereby achieving the insulation.

As the insulation cover 540 according to the present embodiment, the upper rising portion 541 and the like are formed simultaneously with molding of the insulation cover 540 so as to eliminate the need of a work such as bending the insulation paper, thereby improving workability. In addition, even if the distance between the inner wall of the housing 12 and the negative terminal rising portion 524 and the like is small, the lateral rising portion of the insulation cover 540 according to the present embodiment does not interfere with the inner wall of the housing 12.

Figure 25:
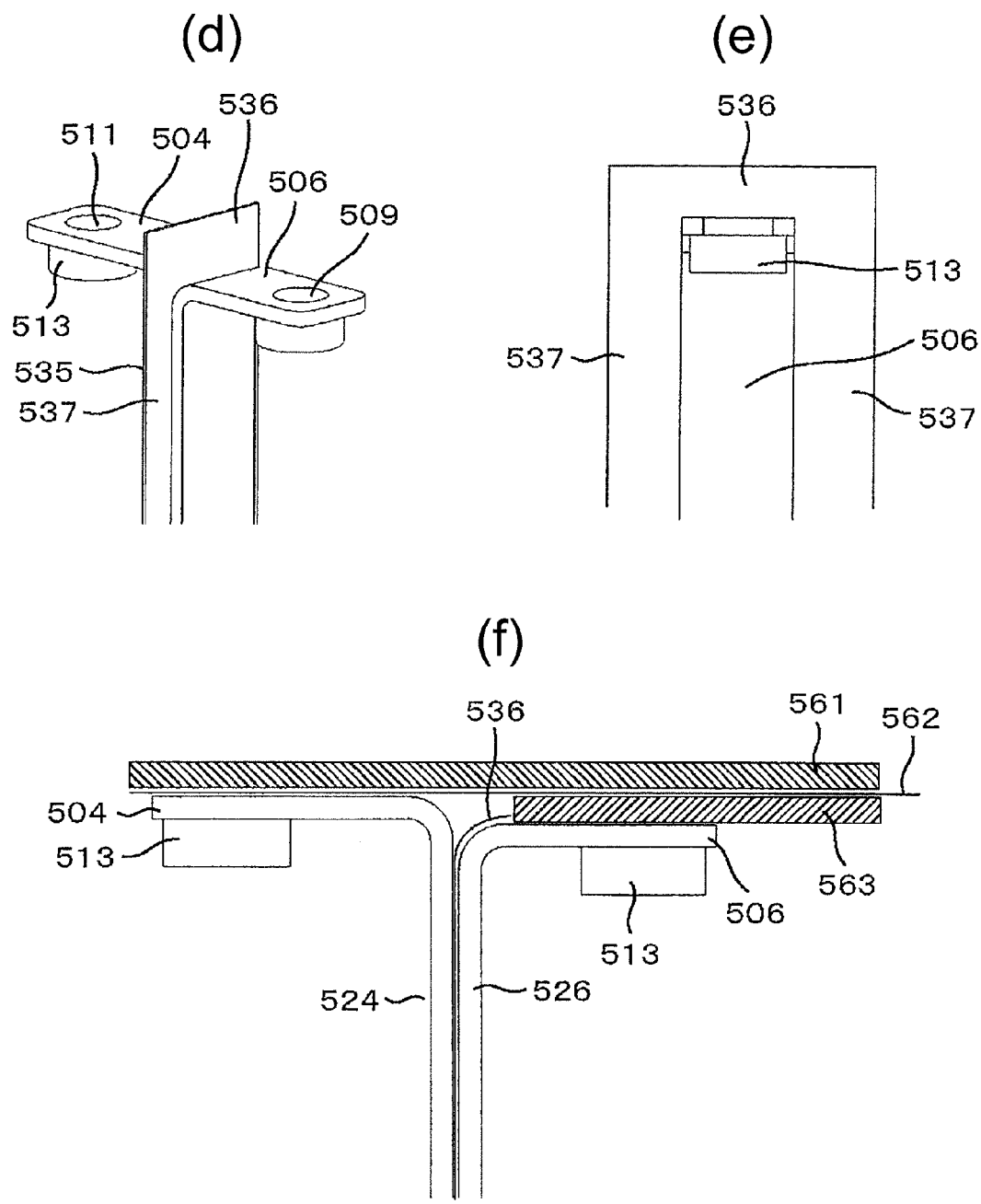
FIG. 25 is an external perspective view of the insulation paper 535 according to another embodiment.

FIG. 25 is an external perspective view of the insulation paper 535 according to the second embodiment. The difference between the insulation paper 535 according to the present embodiment and the insulation cover 540 according to the first embodiment lies in that the insulation paper 535 has an insulation paper upper portion 536 and an insulation paper lateral portion 537 for ensuring the creepage distance for insulation in place of the upper rising portion 541 and the lateral rising portions 542 and 543.

Then, the insulation paper upper portion 536 is bent towards the positive capacitor terminal 506 side. This allows the exposed portion of the positive capacitor terminal 506 to be covered, thereby ensuring insulation of the terminal.

The use of the insulation paper 535 according to the present embodiment allows the insulation to be ensured while reducing the cost.

Figure 26:
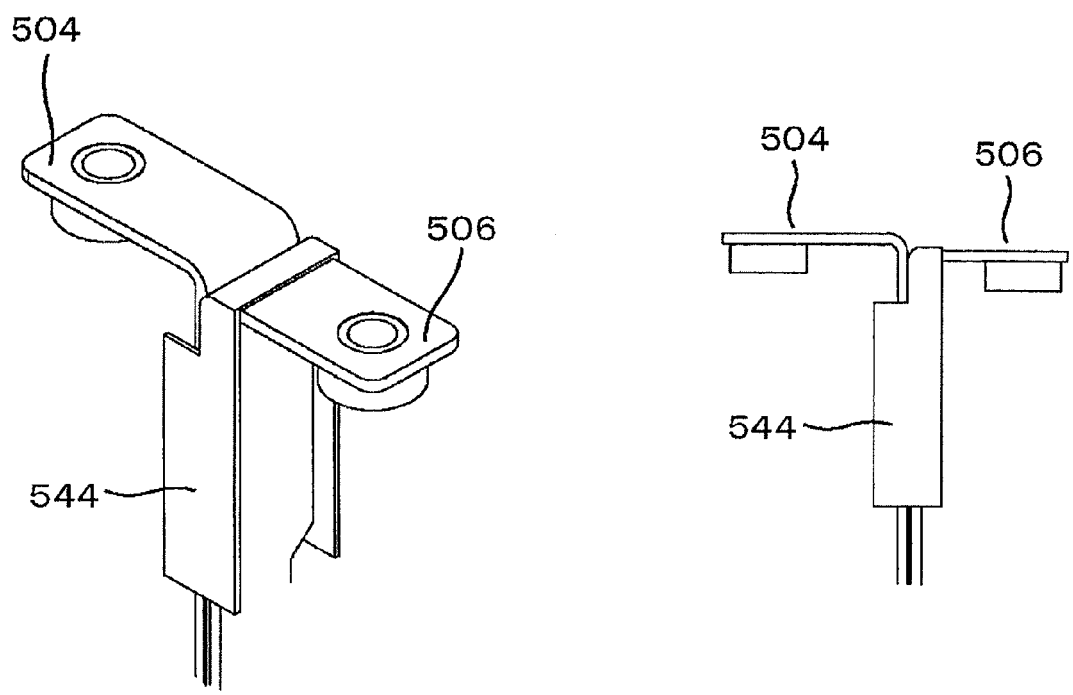
FIG. 26 is an external perspective view of the insulation cover 545 according to another embodiment.

FIG. 26 is an external perspective view of the insulation cover 545 according to the third embodiment. The difference between the insulation cover 545 according to the present embodiment and the insulation cover 540 according to the first embodiment lies in that the insulation cover 545 has a lateral rising portion 544 formed to rise in the opposite direction to the rising direction of the lateral rising portion 543.

The negative terminal rising portion 524 of the housing 12 side is covered with the lateral rising portion 544, thereby ensuring the insulation between the inner wall of the housing 12 and the negative terminal rising portion 524.

It is to be noted that in any of the first to third embodiments, the insulation may be ensured by providing insulation to the inner side of the wall of the housing 12, in particular, the inner side of the wall in the vicinity of the negative terminal rising portion 524 and the positive terminal rising portion 526. Examples of practical insulation processing include alumite treatment or placing an insulation sheet onto the inner side of the wall of the housing 12.

Although the variety of embodiments and examples of variations are described above, the present invention is not to be limited only to these. The other possible embodiments which may be conceived within the scope of the technical idea of the present invention are also included in the present invention.

The disclosure of the following priority application is herein incorporated by reference:
Japanese Patent Application No. 2008-277591 filed Oct. 29, 2008

The invention claimed is:

1. A power conversion device for a vehicle, comprising:
a power module that includes a switching device and, upon operation of the switching device, converts DC power into AC power to be supplied to an electric machine for driving a vehicle;
a capacitor module that includes a smoothing capacitor element, an input-side power source terminal for receiving DC power, a plurality of output-side power source terminals for supplying DC power to the power module and a plate-like conductor, constituted with a positive electrode-side conductor and a negative electrode-side conductor in a superimposed state, that allows the smoothing capacitor element and the input-side power source terminal to be electrically connected; and
a noise removal capacitor for removing noise, wherein:
the noise removal capacitor is built in the capacitor module, and the noise removal capacitor is electrically connected to the input-side power source terminal in a position where a distance between a connection position of the noise removal capacitor and the input-side power source terminal is less than a distance between a connection position of the noise removal capacitor and a first output-side power source terminal of the plurality of output-side power source terminals of the capacitor module;
the first output-side power source terminal of the plurality of output-side power source terminals has a shortest distance from the input-side power source terminal; and
a distance between a connection position at which the smoothing capacitor element and the plate-like conductor are connected with each other and the first output-side power source terminal is shorter than a distance between a connection position at which the input-side power source terminal and the plate-like conductor are connected with each other and the first output-side power source terminal.

2. A power conversion device for a vehicle according to claim 1, wherein:
the input-side power source terminal is placed opposite the first output-side power source terminal across the smoothing capacitor element.

3. A power conversion device for a vehicle according to claim 1, wherein:
the capacitor module includes a case for housing at least the smoothing capacitor element; and
the plate-like conductor is electrically connected with the smoothing capacitor element in a housing portion of the case, extends from the housing portion of the case to outside the case in a superimposed state of the positive electrode-side conductor and the negative electrode-side conductor, and is provided with the first output-side power source terminal formed at a top end of the plate-like conductor.

4. A power conversion device for a vehicle according to claim 3, wherein:
the power module includes a metal housing for housing the capacitor module and the noise removal capacitor;
the metal housing includes a fixing portion for fixing the case of the capacitor module to the metal housing; and
the noise removal capacitor has wiring, which extends from a ground-side terminal of the noise removal capacitor and is electrically connected with the fixing portion.

5. A power conversion device for a vehicle according to claim 1, wherein:
the capacitor module includes a case for housing at least the smoothing capacitor element and the noise removal capacitor; and
a sealing material for sealing the smoothing capacitor element and the noise removal capacitor inside the case.

6. A power conversion device for a vehicle according to claim 5, wherein:
the power module includes a metal housing for housing the capacitor module and the noise removal capacitor;
the metal housing includes a fixing portion for fixing the case of the capacitor module to the metal housing; and
the noise removal capacitor has wiring, which extends from a ground-side terminal of the noise removal capacitor and is electrically connected with the fixing portion.

7. A power conversion device for a vehicle according to claim 1, further comprising:
a discharge circuit section for discharging charge stored in the smoothing capacitor module, wherein:
the discharge circuit section is placed opposite the noise removal capacitor across the smoothing capacitor element.

* * * * *